(12) United States Patent
Wada et al.

(10) Patent No.: US 8,773,017 B2
(45) Date of Patent: Jul. 8, 2014

(54) GLASS-SEALED LED LAMP AND MANUFACTURING METHOD OF THE SAME

(75) Inventors: Satoshi Wada, Kiyosu (JP); Miki Moriyama, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/607,319

(22) Filed: Sep. 7, 2012

(65) Prior Publication Data

US 2013/0063024 A1 Mar. 14, 2013

(30) Foreign Application Priority Data

Sep. 14, 2011 (JP) .................................. 2011-200572
May 24, 2012 (JP) .................................. 2012-119042

(51) Int. Cl.
*H01J 1/62* (2006.01)
*H01J 63/04* (2006.01)

(52) U.S. Cl.
USPC .............. 313/512; 445/25; 313/498; 313/506; 313/509

(58) Field of Classification Search
CPC ........... H01L 2224/48091; H01L 2924/00014; H01L 2924/00; H01L 33/60; H01L 25/0753; H01L 33/62; H01L 2224/48227; H01L 2224/73265; H01L 33/486; H01L 2224/32225; H01L 2224/48247; H01L 33/20; H01L 2224/49171; H01L 33/505; H01L 33/507; H01L 2224/29347; H01L 2224/29355; H01L 2224/2939; H01L 2224/294; H01L 2224/32245; H01L 2224/45144; H01L 2224/48465; H01L 2924/01322; H01L 33/0079; H01L 33/06; H01L 33/30; H01L 33/382; H01L 33/502; H01L 2224/49107
USPC .............. 313/498–512; 445/25; 65/33.5–33.6
See application file for complete search history.

(56) References Cited

U.S. PATENT DOCUMENTS

| | | | |
|---|---|---|---|
| 2005/0173721 A1* | 8/2005 | Isoda ............................. | 257/99 |
| 2006/0261364 A1 | 11/2006 | Suehiro et al. | |
| 2008/0074029 A1* | 3/2008 | Suehiro ........................ | 313/487 |
| 2008/0253132 A1* | 10/2008 | Urabe et al. ................. | 362/327 |
| 2010/0123154 A1* | 5/2010 | Lee .................................. | 257/98 |
| 2012/0067085 A1* | 3/2012 | Yamaguchi et al. ............. | 65/36 |
| 2012/0171789 A1* | 7/2012 | Suehiro et al. .................. | 438/28 |

FOREIGN PATENT DOCUMENTS

| | | |
|---|---|---|
| JP | 11-008414 A | 1/1999 |
| JP | 2008-053545 A | 3/2008 |
| JP | 2008-060428 A | 3/2008 |
| JP | 2011-077176 A | 4/2011 |
| WO | WO2004/082036 A1 | 9/2004 |

\* cited by examiner

*Primary Examiner* — Nimeshkumar Patel
*Assistant Examiner* — Jose M Diaz
(74) *Attorney, Agent, or Firm* — McGinn IP Law Group, PLLC

(57) ABSTRACT

The present invention provides a glass-sealed LED lamp which includes a mounting substrate, an LED chip mounted on the mounting substrate, a glass sealing body, and a glass bonding portion bonding the LED chip to a portion of a lower surface side of the glass sealing body. A clearance between a lower surface of the glass sealing body and an upper surface of the mounting substrate side, which causes total reflection at an interface between the glass sealing body and the clearance, is formed outward of the portion of the lower surface side of the glass sealing body.

27 Claims, 25 Drawing Sheets

F I G. 20A
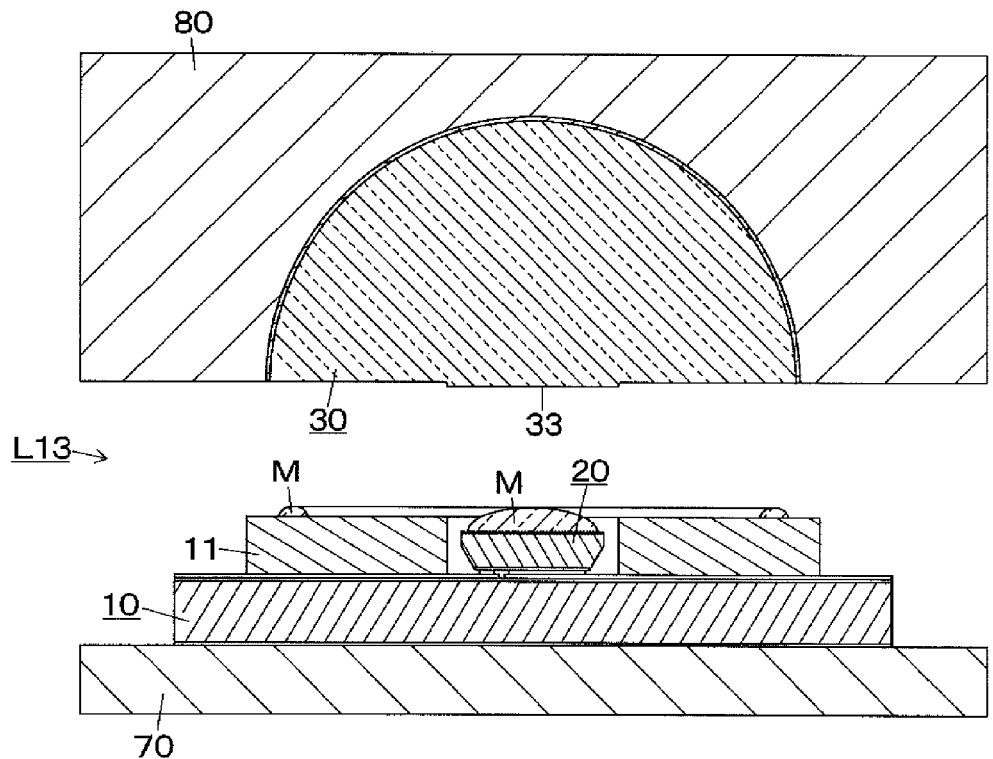
F I G. 20B
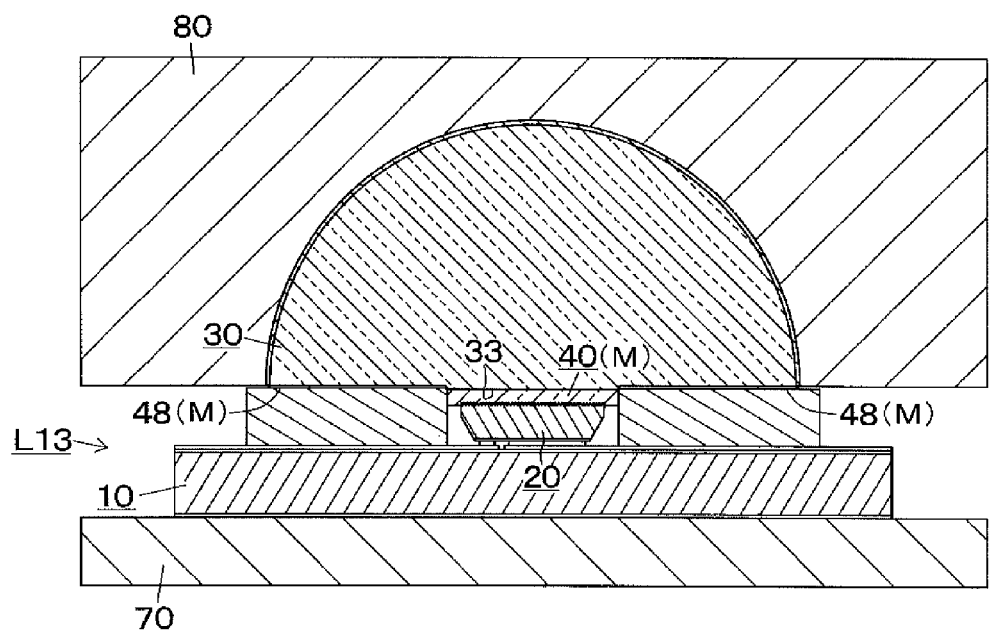

US 8,773,017 B2

GLASS-SEALED LED LAMP AND MANUFACTURING METHOD OF THE SAME

TECHNICAL FIELD

The present invention relates to a glass-sealed LED (light-emitting diode) lamp in which an LED chip mounted on a surface of a mounting substrate is sealed by glass.

BACKGROUND ART

As an LED lamp with use of an LED chip, an LED lamp in which an LED chip mounted on a mounting substrate is sealed by transparent resin is general. However, there have been developed glass-sealed LED lamps in which an LED chip on a mounting substrate is sealed by a glass sealing body made of glass with more excellent heat resistance, light resistance and environment resistance than transparent resin, as described in Patent Literatures 1 to 5.

CITATION LIST

Patent Literature
  Patent Literature 1: Japanese Patent Application Publication No. 11-008414
  Patent Literature 2: International Publication No. 2004/082036
  Patent Literature 3: Japanese Patent Application Publication No. 2008-053545
  Patent Literature 4: Japanese Patent Application Publication No. 2008-060428
  Patent Literature 5: Japanese Patent Application Publication No. 2011-77176

SUMMARY OF INVENTION

Technical Problem

Here, there is a glass sealing body which is made of powdered glass as a material, such as a glass sealing body 93 of a glass-sealed LED lamp 90 in a conventional example shown in FIG. 25 (Patent Literatures 1, 3 to 5). However, in these cases, there are problems [1] and [2] below.

First, as problem [1], the glass sealing body 93 may become cloudy (scatter light) because the glass sealing body is made of powdered glass. Increasing the heating temperature during forming may make it possible to prevent the glass sealing body from becoming cloudy so that the glass sealing body becomes transparent. However, in this case, the heat load may be applied to an LED chip 92.

Next, as problem [2], the whole lower surface of the glass sealing body 93 is bonded to an upper surface of a mounting substrate 91 without any clearance by thermal fusion bonding. Therefore, as shown in FIG. 25, the light emitted toward the mounting substrate 91, among the light emitted from the LED chip 92 (light shown by arrows in the drawing), directly reaches the mounting substrate 91. The reached light is reflected with a reflectivity derived from a material of the mounting substrate 91. Therefore, a portion of the light (part shown with arrows with dashed-two dotted line in the drawing) is reflected on the upper surface of the mounting substrate 91 and taken out to the outside of the glass sealing body 93, but the rest of the light is absorbed on the upper surface of the mounting substrate 91. In order to take the light emitted from the LED chip 92 out of the glass sealing body 93 more efficiently, it is preferable to prevent the absorption of the light by the mounting substrate 91.

There are some cases that the glass sealing body is made of a plate glass instead of power glass, and the whole lower surface of the glass sealing body made of the plate glass is bonded to the upper surface of the mounting substrate by thermal fusion bonding and the like (Patent Literatures 2 and 5). In these cases, because the plate glass is more difficult to become cloudy than the power glass, the problem [1] described above can be solved. However, as in these cases, the problem [2] described above cannot be solved because the whole lower surface of the glass sealing body is bonded to the upper surface of the mounting substrate without any clearance.

An object of the present invention is to suppress the amount of light absorbed by a mounting substrate and to improve the extraction efficiency from a glass sealing body of light emitted from the LED chip.

Solution to Problem

To achieve the object described above, a glass-sealed LED lamp of a first aspect of the present invention includes: a mounting substrate; an LED chip mounted on the mounting substrate; a glass sealing body; and a glass bonding portion bonding the LED chip to a portion of a lower surface side of the glass sealing body, wherein a clearance between a lower surface of the glass sealing body and an upper surface of the mounting substrate side is formed outward of the portion of the lower surface side of the glass sealing body, the clearance causing total reflection at an interface between the glass sealing body and the clearance.

The portion of the lower surface side of the glass sealing body is not specifically limited, and the examples [1] to [3] are shown below.

[1] An example in which a portion of the lower surface of the glass sealing body is the portion of the lower surface side.
  [2] An example in which a portion of the lower surface of the glass sealing body is provided with a recess, and the recess is the portion of the lower surface side.
  [3] An example in which a portion of the lower surface of the glass sealing body is provided with a protrusion, and the protrusion is the portion of the lower surface side.

The upper surface of the mounting substrate side is not specifically limited, and the examples [1] and [2] are shown below.

[1] An example in which an upper surface of the mounting substrate is the upper surface of the mounting substrate side.
  [2] An example in which an upper surface of a mounted object mounted on the mounting substrate side is the upper surface of the mounting substrate side.

Here, the mounted object is not specifically limited, but a peripheral wall member mounted outward of the LED chip is exemplified.

To achieve the object described above, a glass-sealed LED lamp of a second aspect of the present invention includes: a mounting substrate; an LED chip mounted on the mounting substrate; a glass sealing body having a recess in a portion of a lower surface of the glass sealing body, the recess having an inner peripheral surface that is larger than an outer peripheral surface of the LED chip; and a glass bonding portion bonding the LED chip to the recess, wherein a clearance between a lower surface of the glass sealing body and an upper surface of the mounting substrate is formed outward of the recess, the clearance causing total reflection at an interface between the glass sealing body and the clearance.

In the present specification, with respect to the top and bottom of each portion of the glass-sealed LED lamp, the side where the mounting substrate is provided is referred to as "lower" and the side where the mounted object is provided is referred to as "upper" of the two opposing sides of the mounting substrate side and the mounted object (such as an LED chip and a glass sealing body) side.

A refractive index of the glass sealing body is not specifically limited, but 1.5 or more is preferable, and 1.7 or more is more preferable. It is because the larger the difference between the refractive index of the glass sealing body and the refractive index of the clearance (nearly equal to 1.00) is, the more the total reflection occurs (a critical angle becomes smaller) even if a tilt (an incident angle) relative to the normal perpendicular to the interface is small, whereby a greater amount of light is totally reflected at the interface. The specific material of the glass sealing body is not specifically limited, but zinc oxide glass, borosilicate glass and the like are exemplified. It should be noted that these are similarly applicable to the glass-sealed LED lamps of the first aspect and a third aspect of the present invention.

The glass bonding portion is not specifically limited, but it is preferable to be formed of glass having a yielding point lower than a yielding point of the glass forming the glass sealing body. More specifically, the yielding point of the glass bonding portion is preferably to be lower than the yielding point of the glass sealing body by 10° C. or more, and more preferably 30° C. or more. It is because the larger the difference of the yielding point, the more easily the glass bonding portion only can be softened without softening the glass sealing body. The specific material of the glass bonding portion is not specifically limited, but phosphate glass, bismuth oxide glass and the like are exemplified. It should be noted that these are similarly applicable to the glass-sealed LED lamps of the first aspect and the third aspect of the present invention.

The glass sealing body is not specifically limited, and the examples [1] and [2] are shown below.

An example in which the glass sealing body is formed in a semispherical shape, the lower surface is round, and the recess is formed in a central portion of the lower surface.

[2] An example in which the glass sealing body is formed in a rectangular parallelepiped shape, the lower surface is rectangular, and the recess is formed in a central portion of the lower surface.

The LED chip may be only one, and a plurality of LED chips may be mounted on the mounting substrate and a plurality of recesses may be formed on the lower surface of the glass sealing body.

The mounting substrate is not specifically limited, but it is preferable that a peripheral wall member reflecting light inward on an inner peripheral surface of the peripheral wall member be mounted outward of the LED chip on the mounting substrate because this configuration further improves the extraction efficiency of light.

The peripheral wall member is not specifically limited, but the examples of the following [1] and [2] are preferable, because the extraction efficiency of the light can be further improved by the total reflection.

[1] An example in which the peripheral wall member is provided inward of the recess, and a side clearance causing the total reflection at an interface between the LED chip and the side clearance is formed between the outer peripheral surface of the LED chip and the inner peripheral surface of the peripheral wall member.

[2] An example in which the peripheral wall member is provided outward of the glass sealing body, and a side clearance causing the total reflection at an interface between the glass sealing body and the side clearance is formed between an outer peripheral surface of the glass sealing body and an inner peripheral surface of the peripheral wall member.

To achieve the object described above, a glass-sealed LED lamp of a third aspect of the present invention includes: amounting substrate; an LED chip mounted on the mounting substrate; a peripheral wall member mounted outward of the LED chip on the mounting substrate, the peripheral wall member reflecting light inward on an inner peripheral surface of the peripheral wall member; a glass sealing body; and a glass bonding portion bonding an upper surface of the LED chip to a portion of a lower surface side of the glass sealing body, wherein a clearance between a lower surface of the glass sealing body and an upper surface of the peripheral wall member is formed outward of the portion of the lower surface side of the glass sealing body, the clearance causing total reflection at an interface between the glass sealing body and the clearance.

The portion of the lower surface side of the glass sealing body is not specifically limited, and the examples of [1] and [2] are shown below. However, the example [2] is more preferable at the point that the protrusion makes it easier to bond the portion of the lower surface side of the glass sealing body to the LED chip.

[1] An example in which a portion of a lower surface of the glass sealing body is the portion of the lower surface side.

[2] An example in which the glass sealing body is provided with a protrusion in the portion of the lower surface, the protrusion having an outer peripheral surface that is smaller than an inner peripheral surface of the peripheral wall member, and the protrusion is the portion of the lower surface side.

In the example provided with the peripheral wall member of the glass-sealed LED lamp of the second aspect in the present invention and in the glass-sealed LED lamp of the third aspect, the inner peripheral surface of the peripheral wall member is not specifically limited, and the examples of [1] and [2] are shown below.

[1] An example in which the inner peripheral surface of the peripheral wall member is a vertical surface perpendicular to the upper surface of the mounting substrate.

[2] An example in which the inner peripheral surface of the peripheral wall member is an inclined surface inclined relative to a vertical surface perpendicular to the upper surface of the mounting substrate in such a manner that an upper side is located outward of a lower side.

The example [1] has a disadvantage in that it is difficult to reflect light toward the opening of the peripheral wall member and an advantage in that it is possible to make the peripheral wall member compact compared to [2]. Meanwhile, the example [2] has an advantage in that it is easy to reflect light toward the opening of the peripheral wall member and a disadvantage in that it is impossible to make the peripheral wall member compact compared to [1].

The inner peripheral surface of the peripheral wall member is not specifically limited, but it is preferable that white resin or white glass is provided on the inner peripheral surface, because it can improve the reflectivity, whereby further improve the extraction efficiency of the light.

The LED chip may be only one, and a plurality of LED chips may be mounted on the mounting substrate and the peripheral wall member may be mounted outward of the plurality of the LED chips.

In the glass-sealed LED lamps of the first aspect to the third aspect of the present invention, the glass sealing body may be bonded to the mounting substrate only through the glass bonding portion, but it is preferable that a supporting portion to support the glass sealing body for the mounting substrate is provided outward of the LED chip, because the glass sealing body becomes more stable. As the supporting portion, the examples [1] to [4] are shown below.

[1] An example in which the supporting portion includes a protrusion protruding downward from the lower surface of the glass sealing body to abut on the upper surface of the mounting substrate side.

[2] An example in which the supporting portion includes a protrusion protruding upward from the upper surface of the mounting substrate side to abut on the lower surface of the glass sealing body.

[3] An example in which the supporting portion includes an engaging protrusion protruding downward from the lower surface of the glass sealing body to be engaged with the mounting substrate side.

[4] A example in which the supporting portion includes an outside glass bonding portion bonding the lower surface of the glass sealing body to the upper surface of the mounting substrate side.

The glass bonding portion may be a layer formed of only glass, but it is preferable to be a fluorescent material layer including a phosphor, because the angle chromaticity distribution can be suppressed.

Wiring to the LED chip is not specifically limited, but a metal wire for supplying electricity to the LED chip may be passed inside the interior of the glass bonding portion, because a circuit for supplying electricity to the LED chip can be provided to the upper side of the LED chip by the metal wire.

The lower surface of the glass sealing body is not specifically limited, but it is preferable that a dielectric film causing reflection is formed on the lower surface of the glass sealing body in contact with the clearance, because the incident light at a deep angle within a range which does not cause the total reflection in the clearance can also be partly reflected on the dielectric film.

The material of the dielectric film is not specifically limited, but $Al_2O_3$, $CeO_2$, $Cr_2O_3$, $HfO_2$, Indium Tin Oxide (ITO), $La_2O_3$, MgO, $Nb_2O_5$, NiO, $SiO_2$, SiN, SiON, $Ta_2O_5$, TiO, $TiO_2$, $Ti_3O_5$, $Y_2O_3$, $WO_3$, $ZrO_2$, $AlF_3$, $CaF_3$, $CeF_3$, $GdF_3$, $LaF_3$, LiF, $MgF_2$, $NbF_3$ and $YF_3$ are exemplified.

The material of the mounting substrate and the peripheral wall member is not specifically limited, but a material whose linear expansion coefficient is close to that of the glass sealing body is preferable. More specifically, alumina (aluminum oxide), AlN (aluminumnitride), other metals, resins, composite materials (such as metal laminated plates and carbon composite materials) and the like are exemplified.

To achieve the objects, a manufacturing method of a glass-sealed LED lamp of the first aspect of the present invention includes mounting an LED chip on a mounting substrate; setting the mounting substrate in a mold provided with an engaging guide portion guiding an engaging protrusion of a glass sealing body provided with the engaging protrusion in a direction which engages the engaging protrusion with the mounting substrate; and arranging melting glass that has been heated and softened to one of a portion of a lower surface side of the glass sealing body and an upper surface of the LED chip, and pressing the other against the melting glass and pressing the engaging protrusion against the engaging guide portion so that the upper surface of the LED chip is bonded to the portion of the lower surface side of the glass sealing body through the melting glass, the engaging protrusion is engaged with the mounting substrate to be deformed along the engaging guide portion, and a clearance between a lower surface of the glass sealing body and the upper surface of the mounting substrate side, which causes total reflection at an interface between the glass sealing body and the clearance, is formed outward of the portion of the lower surface side of the glass sealing body.

To achieve the objects, a manufacturing method of a glass-sealed LED lamp of the second aspect of the present invention includes: mounting an LED chip on a mounting substrate; putting melting glass having a yielding point lower than a yielding point of the glass sealing body into a recess of the glass sealing body provided with the recess in a portion of a lower surface of the glass sealing body, the recess having an inner peripheral surface that is larger than an outer peripheral surface of the LED chip; heating the melting glass at a temperature of the yielding point of the melting glass or more and the yielding point of the glass sealing body or less to soften the melting glass, and pressing the LED chip against the melting glass so that the LED chip is bonded to the recess of the glass sealing body through the melting glass, and a clearance between a lower surface of the glass sealing body and the upper surface of the mounting substrate, which causes total reflection at an interface between the glass sealing body and the clearance, is formed outward of the recess.

The clearance is not specifically limited, but it is preferable that the clearance is formed between a portion other than a portion where printed wiring is provided on the upper surface of the mounting substrate and the lower surface of the glass sealing body by making the lower surface of the glass sealing body abut on the printed wiring. The printed wiring is formed on the upper surface of the mounting substrate and is raised relative to the portion other than the portion where the printed wiring is provided on the upper surface of the mounting substrate.

To achieve the objects, a manufacturing method of a glass-sealed LED lamp of the third aspect of the present invention includes: mounting an LED chip on a mounting substrate; mounting a peripheral wall member outward of the LED chip on the mounting substrate; arranging melting glass that has been heated and softened on one of a lower surface of a protrusion of a glass sealing body provided with the protrusion in a portion of a lower surface of the glass sealing body and an upper surface of the LED chip, the protrusion having an outer peripheral surface smaller than an inner peripheral surface of the peripheral wall member; and pressing the other against the melting glass so that the upper surface of the LED chip is bonded to the lower surface of the protrusion of the glass sealing body through the melting glass, and a clearance between a lower surface of the glass sealing body and the upper surface of the peripheral wall member, which causes total reflection at an interface between the glass sealing body and the clearance, is formed outward of the protrusion.

Advantageous Effects of Invention

According to the glass-sealed LED lamp of the first aspect of the present invention, because there is a clearance between the lower surface of the glass sealing body and the upper surface of the mounting substrate side, which causes total reflection at an interface between the glass sealing body and the clearance, it is possible to reduce the amount of light that reaches the mounting substrate side and is absorbed by the mounting substrate side, and improve the extraction efficiency from the glass sealing body of the light emitted from the LED chip.

According to the glass-sealed LED lamp of the second aspect of the present invention, because there is a clearance between the lower surface of the glass sealing body and the upper surface of the mounting substrate, which causes total reflection at an interface between the glass sealing body and the clearance, it is possible to reduce the amount of light that reaches the mounting substrate and is absorbed by the mounting substrate, and improve the extraction efficiency from the glass sealing body of the light emitted from the LED chip.

According to the glass-sealed LED lamp of the third aspect of the present invention, because there is a clearance between the lower surface of the glass sealing body and the upper surface of the peripheral wall member, which causes total reflection at an interface between the glass sealing body and the clearance, it is possible to reduce the amount of light that reaches the peripheral wall member and is absorbed by the peripheral wall member, and improve the extraction efficiency from the glass sealing body of the light emitted from the LED chip.

According to the manufacturing method of the first aspect of the present invention, it is possible to manufacture the glass-sealed LED lamp of the first aspect of the present invention and to engage the engaging portion with the mounting substrate. According to the manufacturing method of the second aspect of the present invention, it is possible to manufacture the glass-sealed LED lamp of the second aspect of the present invention. According to the manufacturing method of the third aspect of the present invention, it is possible to manufacture the glass-sealed LED lamp of the third aspect of the present invention.

BRIEF DESCRIPTION OF DRAWINGS

FIGS. 20A and 20B are front sectional views showing a manufacturing process of the glass-sealed LED lamp of the thirteenth embodiment;

DESCRIPTION OF EMBODIMENTS

First Embodiment

Figure 1A:
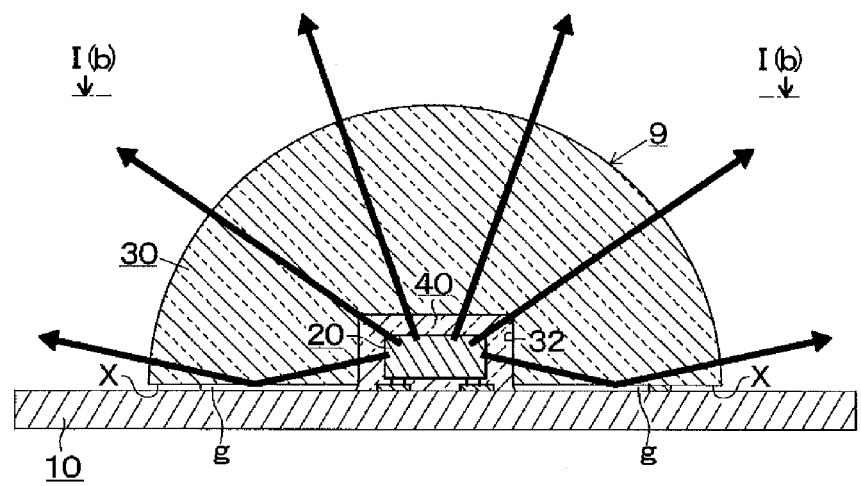
FIG. 1A is a sectional view taken along line I(a)-I(a) in FIG. 1B, showing a glass-sealed LED lamp of a first embodiment.

A glass-sealed LED lamp 9 of a first embodiment, as shown in FIGS. 1A to 3C, includes a mounting substrate 10, an LED chip 20, a glass sealing body 30, and a glass bonding portion 40 as described below.

The mounting substrate 10 is formed in a rectangular plate shape, and printed wirings 15, 15 are formed on an upper surface of the mounting substrate 10 (a surface where a mounted object is mounted). The printed wirings 15, 15 protrude relative to a portion other than a portion where the printed wirings 15, 15 are formed on the mounting substrate 10. The material of the mounting substrate 10 is aluminum nitride.

The LED chip 20 is mounted at a central portion of the upper surface of the mounting substrate 10. In more detail, the LED chip 20 is bonded to ends of the printed wirings 15, 15 located at a central portion of the upper surface of the mounting substrate 10 through Au stud bumps 25, 25 by flip chip bonding (FCB).

The glass sealing body 30 is a glass (zinc oxide glass or borosilicate glass) formed in a semispherical shape, and a lower surface (a surface which faces the mounting substrate 10) of the glass sealing body 30 is round. The glass sealing body 30 is provided with a recess 32 having an inner peripheral surface that is larger than an outer peripheral surface of the LED chip 20 at a central portion of the lower surface. In addition, the lower surface of the glass sealing body 30 abuts on the printed wirings 15, 15 located on the upper surface of the mounting substrate 10 so that a clearance g is formed between the portion of the upper surface of the mounting substrate 10 other than the portion where the printed wirings 15, 15 is formed and the lower surface of the glass sealing body 30 The clearance g causes total reflection at an interface X between the glass sealing body 30 and the clearance g.

The glass bonding portion 40 is formed of melting glass M (phosphate glass or bismuth oxide glass) that is provided in the recess 32 of the glass sealing body 30 and whose yielding point is lower than that of the glass sealing body 30. The upper bottom surface and inner peripheral surface of the recess 32 is bonded to the upper surface, lower surface and outer peripheral surface of the LED chip 20, and the upper surface of the mounting substrate 10 by thermal fusion bonding. Phosphor powder or microcrystalline phosphor is mixed in, precipitated on or mixed and sintered in the melting glass M.

The glass-sealed LED lamp 9 of the first embodiment is manufactured according to the following procedures of [1] to [5].

Figure 3A:
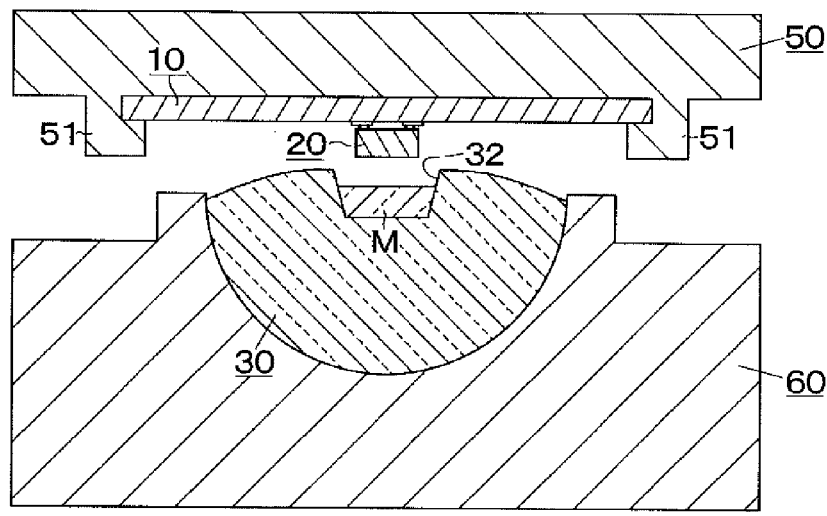
FIGS. 3A to 3C are front sectional views showing a manufacturing process of the glass-sealed LED lamp of the first embodiment.

[1] First, as shown in FIG. 3A, after the LED chip 20 is mounted on the mounting substrate 10, the mounting substrate 10 is set in an upper mold 50 with the upper surface of the mounting substrate (the surface where a mounted object such as an LED chip 20 is mounted) facing downward. The upper mold 50 is provided with set structures 51, 51 for setting the mounting substrate 10.

[2] As shown in FIG. 3A, the glass sealing body 30 is set in a lower mold 60 whose molding surface is in a semispherical shape with the lower surface of the glass sealing body 30 (the surface which faces the mounting substrate 10) facing upward. Then, powder glass for melting M (phosphate glass or bismuth oxide glass) whose yielding point is lower than that of the glass sealing body 30 (zinc oxide glass or borosilicate glass) is put in the recess 32 of a lower surface (an upper surface in FIG. 3) of the glass sealing body 30. Phosphor powder or microcrystalline phosphor is mixed in the melting glass M.

[3] Next, the melting glass M put in the recess 32 is heated and softened by heating the glass sealing body 30 in the lower mold 60. As a heating temperature at this time, a temperature in which the melting glass M is sufficiently softened but the glass sealing body 30 is not softened, that is, a temperature that is higher than the yielding point of the melting glass M and is lower than the yielding point of the glass sealing body 30, is selected. More specifically, a temperature near the melting point of the melting glass M in a range from the glass transition point to near the yielding point of the glass sealing body 30 may be selected.

Figure 3B:
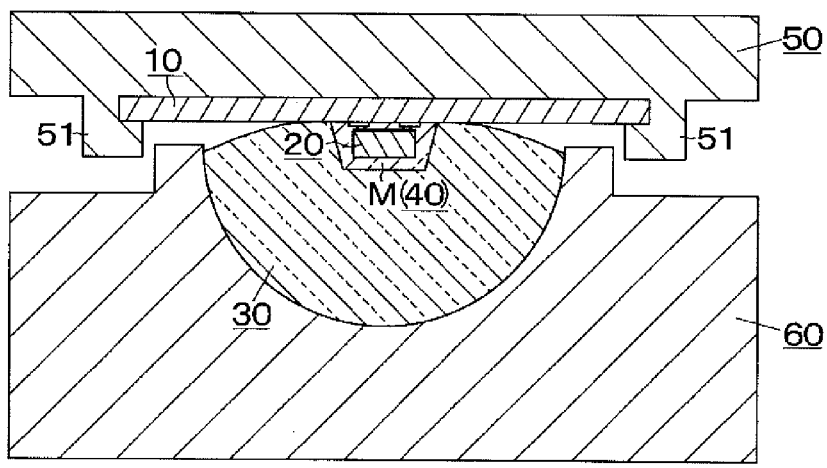
Figure 3C:
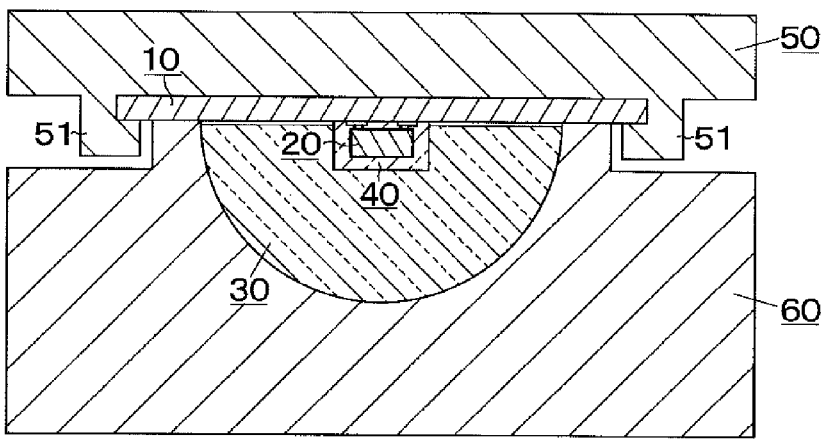
Figure 4A:
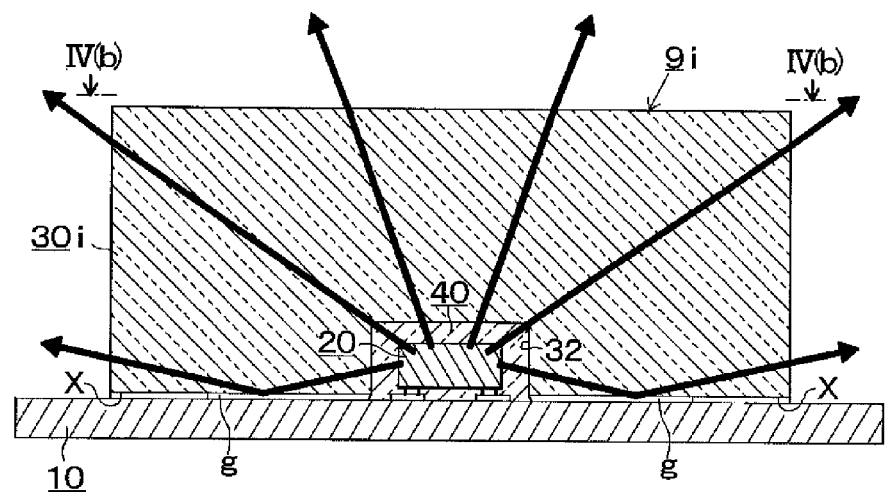
FIG. 4A is a sectional view taken along line IV(a)-IV(a) in FIG. 4B, showing a glass-sealed LED lamp of a second embodiment.
Figure 4B:
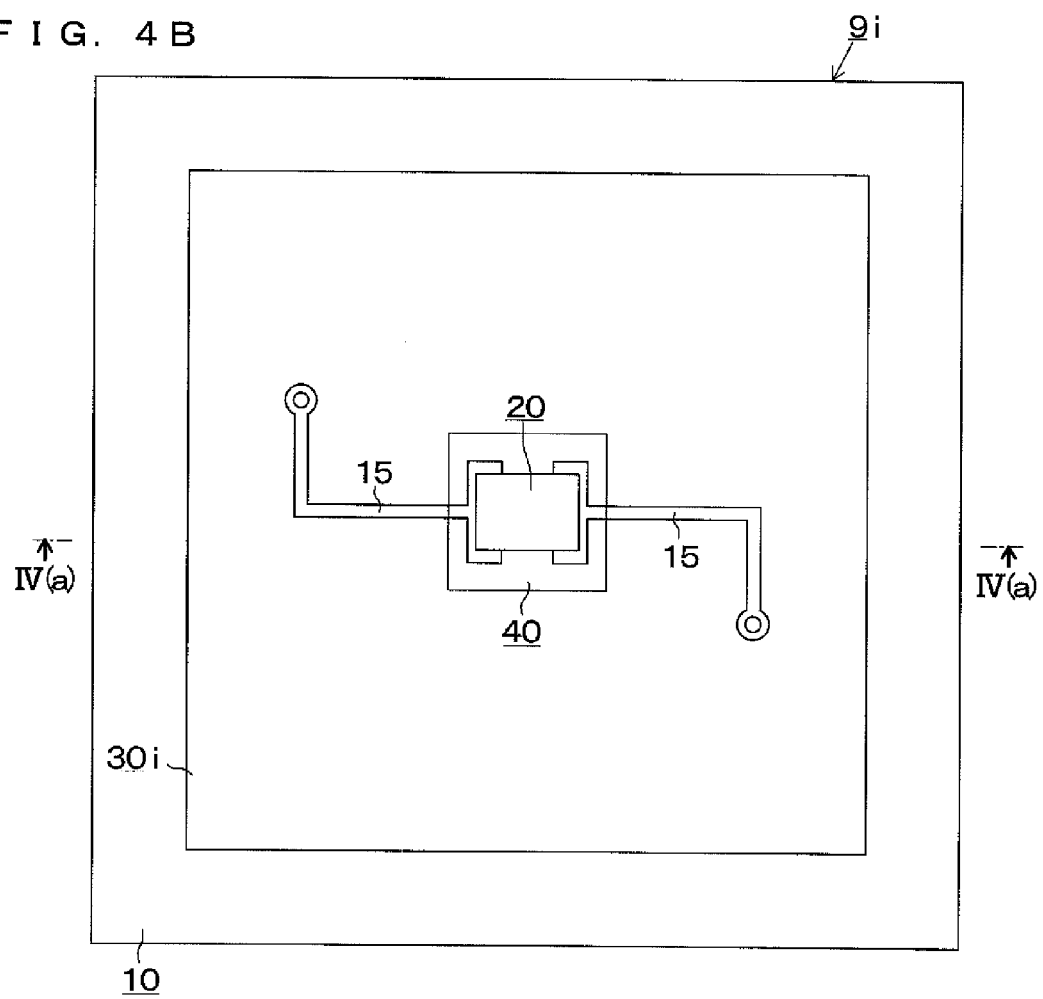
FIG. 4B is a plan view showing the glass-sealed LED lamp of the second embodiment.
Figure 5A:
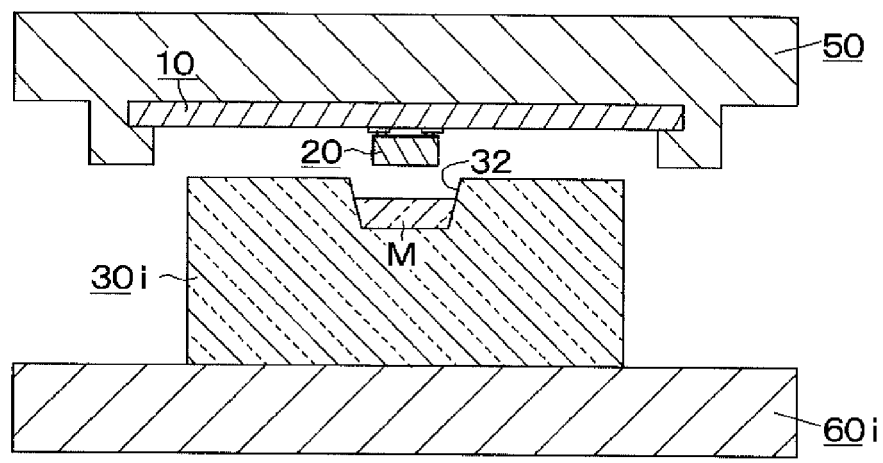
FIGS. 5A and 5B are front sectional views showing a manufacturing process of the glass-sealed LED lamp of the second embodiment.
Figure 5B:
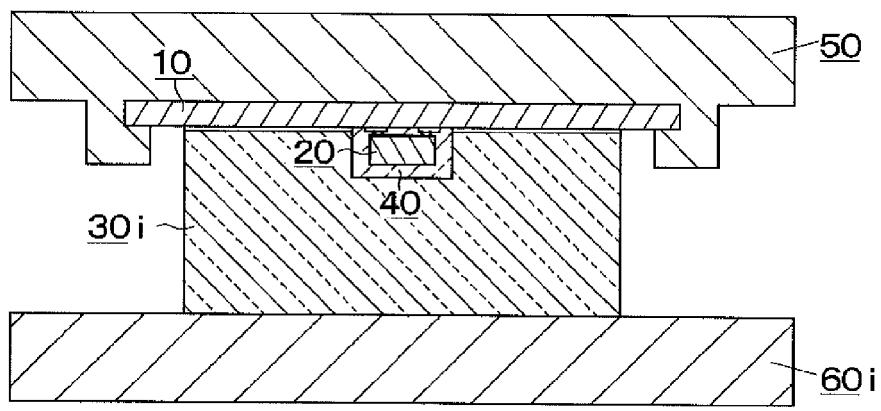

[4] Next, as shown in FIG. 3B and FIG. 3C, a pressing is conducted by placing the upper mold 50 in which the mounted substrate 10 has been set, on the lower mold 60. Thereby, the upper surface (the lower surface in FIG. 3) of the LED chip 20 in a central portion of the upper surface (the lower surface in FIG. 3) of the mounting substrate 10 is pressed against the melting glass M, and the printed wirings 15, 15 located on the upper surface (the lower surface in FIG. 3) of the mounting substrate 10 is pressed against the lower surface (the upper surface in FIG. 3) of the glass sealing body 30. Thereby, the upper bottom surface (the lower bottom surface in FIG. 3) and inner peripheral surface of the recess 32 of the glass sealing body 30 is fusion-bonded to the upper surface (the lower surface in FIG. 3), the lower surface (the upper surface in FIG. 3) and the outer peripheral surface of the LED chip 20 and the upper surface (the lower surface in FIG. 3) of the mounting substrate 10 through the melting glass M (the glass bonding portion 40), and the clearance g is formed between the lower surface (the upper surface in FIG. 3) of the glass sealing body 30 and the portion other than the portion where the printed wirings 15, 15 of the upper surface (the lower surface in FIG. 3) of the mounting substrate 10 is formed. Thereby, the LED chip 20 is sealed from the surroundings of the glass bonding portion 40, and the glass bonding portion 40 is sealed between the upper surface (the lower surface in FIG. 3) of the mounting substrate 10 and the upper bottom surface (the lower bottom surface in FIG. 3) and inner peripheral surface of the recess 32 of the glass sealing body 30. In addition, at this time, the shape of the molding surface of the lower mold 60 is transferred to a curved surface in a semispherical shape of the glass sealing body 30. As described above, the glass-sealed LED lamp 9 which includes the mounting substrate 10, the LED chip 20, the glass sealing body 30, and the glass bonding portion 40 is formed inside of a mold which includes the upper mold 50 and the lower mold 60.

Figure 1B:
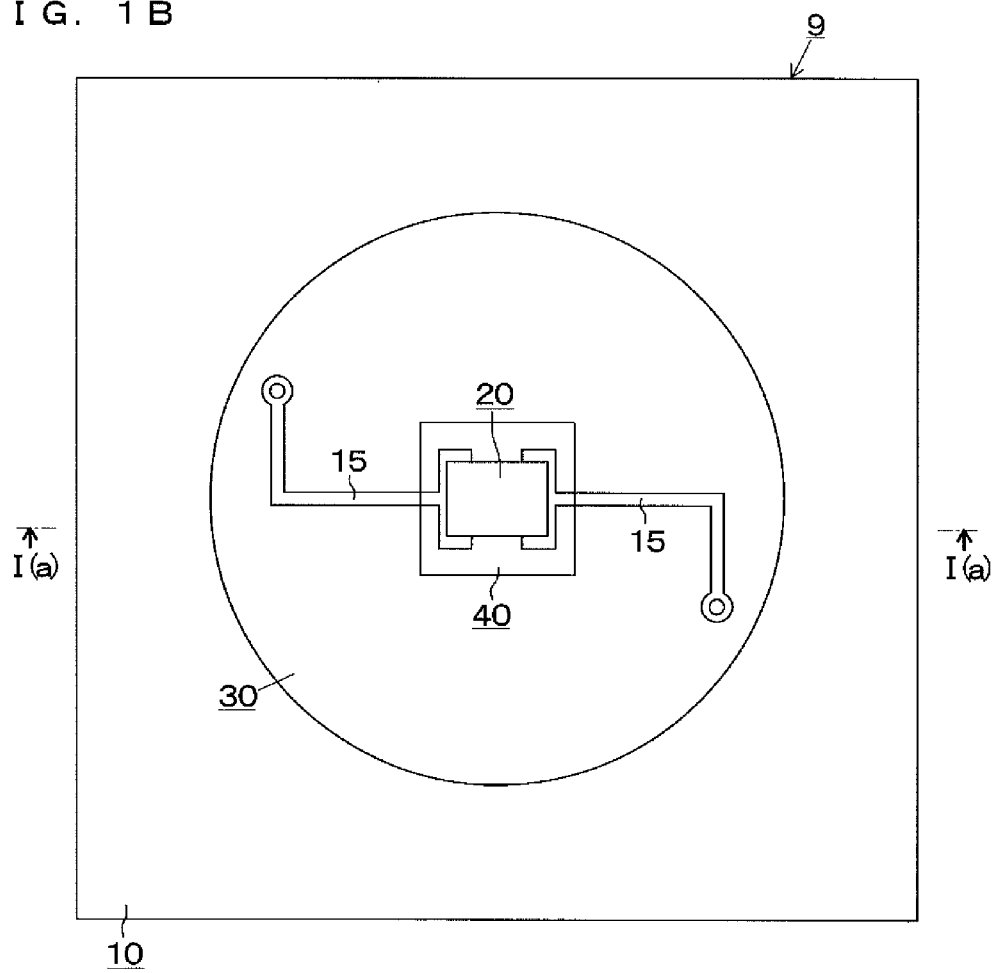
FIG. 1B is a plan view showing the glass-sealed LED lamp of the first embodiment.
Figure 2A:
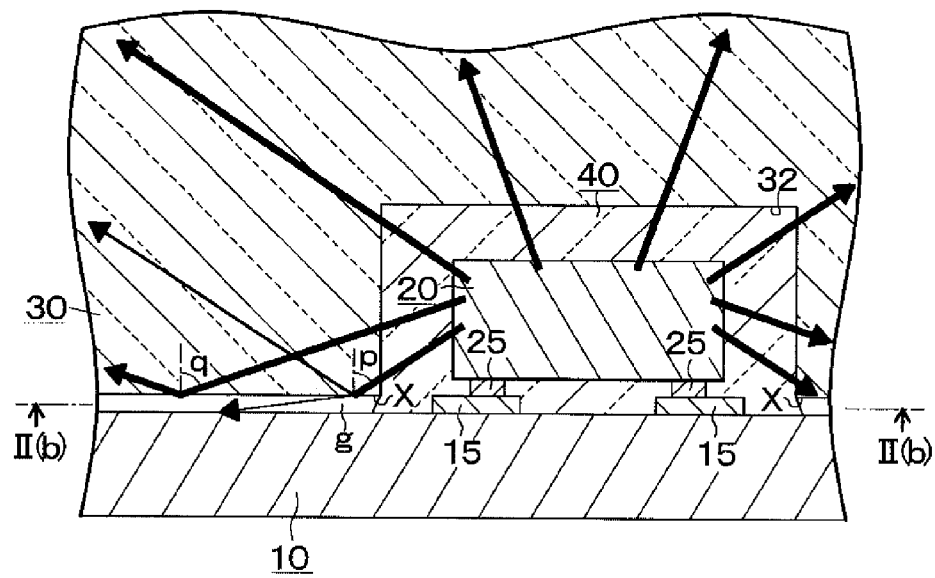
FIG. 2A is a sectional view taken along line II(a)-II(a) in FIG. 2B, showing the glass-sealed LED lamp of the first embodiment.
Figure 2B:
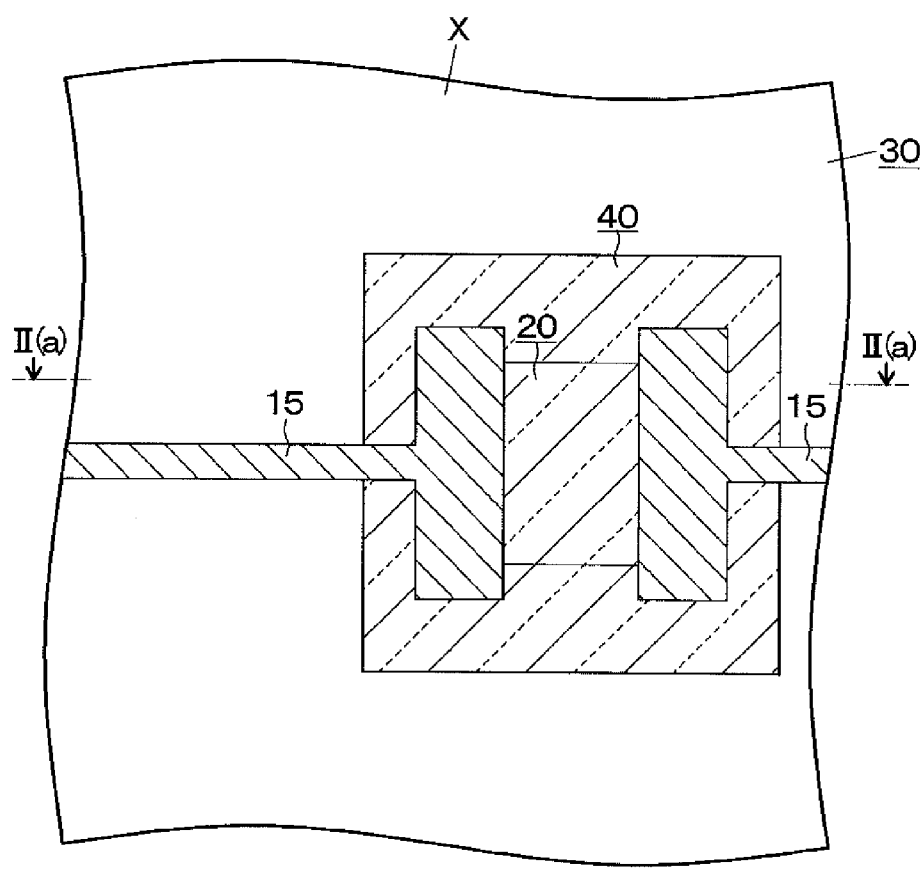
FIG. 2B is a partially enlarged sectional view as seen from the bottom, showing the glass-sealed LED lamp of the first embodiment.

[5] Next, the upper mold 50 is opened against the lower mold 60, and the mounting substrate 10 is removed from the set structures 51, 51 of the upper mold 50. Then, the glass-sealed LED lamp 9 shown in FIG. 1 and FIG. 2 is obtained.

According to the glass-sealed LED lamp 9 of the first embodiment, the following effects [A] to [G] can be obtained.

[A] The clearance g is provided between the mounting substrate 10 and the glass sealing body 30. Therefore, among the light emitted from the LED chip 20 (the light shown by bold arrows in the drawings), a portion of the light incident to the interface X between the glass sealing body 30 and the clearance g at an incident angle p of less than a critical angle of total reflection is transmitted to the clearance g without being reflected and reaches the mounting substrate 10. However, the light incident to the interface X with an incident angle q of the critical angle or more is not transmitted to the clearance g and is totally reflected. Thus, it is possible to improve the extraction efficiency from the glass sealing body 30 of the light emitted from the LED chip 20 by reducing the amount of the light which reaches the mounting substrate 10 and is absorbed by the mounting substrate 10. It is also possible to improve the extraction efficiency of the light by reducing the amount of the light which reaches the mounting substrate 10 and is transmitted through the mounting substrate 10.

[B] The melting glass M (the glass bonding portion 40) has a yielding point lower than that of the glass sealing body 30. Therefore, it is possible to soften the melting glass M even at a temperature lower than the yielding point of the glass sealing body 30 at which the glass sealing body 30 is not softened so as to ensure the bonding (adherence) of the recess 32 of the glass sealing body 30 to the LED chip 20 and the mounting substrate 10.

[C] The clearance g is formed between the lower surface (the upper surface in FIG. 3) of the glass sealing body 30 and the portion of the upper surface (the lower surface in FIG. 3) of the mounting substrate 10 other than the portion where the printed wirings 15, 15 are formed by causing the printed wirings 15, 15 of the upper surface (the lower surface in FIG. 3) of the mounting substrate 10 to abut on the lower surface (the upper surface in FIG. 3) of the glass sealing body 30. It is easy to form the clearance g.

[D] The phosphor is mixed in the glass bonding portion 40. Therefore, it is possible to improve the extraction efficiency of the light from the glass bonding portion 40. In addition, because the phosphor is provided inside the glass bonding portion 40, it is possible to protect the phosphor from the outside air and to provide a glass-sealed LED lamp 9 with the excellent controllability of the light distribution.

[E] After powdered glass for melting M (the glass bonding portion 40) is heated and softened by heating the lower mold 60, the upper mold 50 in which the mounting substrate 10 is set is placed on the lower mold 60. Therefore, it is possible to suppress the heat load and load damage on the LED chip 20 compared to the case where after the upper mold 50 is placed on the lower mold 60, the glass bonding portion 40 is heated.

[F] In the case where the orientation of the light (the light distribution) emitted from the LED chip 20 and passing through the glass bonding portion 40 is controlled by the glass sealing body 30, the glass becomes cloudy (causing a scattering of light) if powdered glass is used as the glass sealing body 30. Therefore, it is impossible to control the light distribution. However, in the first embodiment, only the glass bonding portion 40 is made of powdered glass and the glass sealing body 30 is not made of powdered glass. Therefore, no light scattering occurs in the glass sealing body 30, and the first embodiment provides the excellent controllability of the light distribution. Even if the glass sealing body 30 is made of powdered glass, increasing the heating temperature may make the glass to become transparent. However, in this case, the heat load on the LED chip 20 and the fusion bonding to the mounting substrate 10 or the lower mold 60 due to the softening of the glass sealing body 30 are concerns. However, in the first embodiment, the heating temperature is not increased, whereby it is possible to reduce the heat load on the LED chip 20 and to prevent the fusion bonding of the glass sealing body 30 to the lower mold 60, and it is easy to manufacture glass in any shape.

[G] The melting glass M (the glass bonding portion 40) is put between the upper surface (the lower surface in FIG. 3) of the mounting substrate 10 and the lower surface (the upper surface in FIG. 3) of the LED chip 20. Therefore, it is possible to reduce the load on the Au stud bumps 25, 25 during pressing.

Second Embodiment

A glass-sealed LED lamp 9i and molds (the upper mold 50 and a lower mold 60i) of a second embodiment shown in FIGS. 4A to 5B are generally the same as those of the first embodiment. However, only the shape of each of a glass sealing body 30i and the lower mold 60i is different from that of the first embodiment, and the others are the same as the first embodiment. For details, the glass sealing body 30i is formed in a rectangular parallelepiped shape, has a lower surface (the surface which faces the mounting substrate 10) of which is rectangular, and is provided with the recess 32 at a central portion of the lower surface. In addition, the lower mold 60i is in a plate shape, and has a surface on which a pattern having microscopic asperities, lattice, semispherical shapes and the like is formed, and is configured to transfer the pattern to the surface of the glass sealing body 30i.

According to the second embodiment, it is possible to manufacture the glass-sealed LED lamp 9i with the mold 60i having a simpler structure than the lower mold 60 of the first embodiment.

Third Embodiment

Figure 6A:
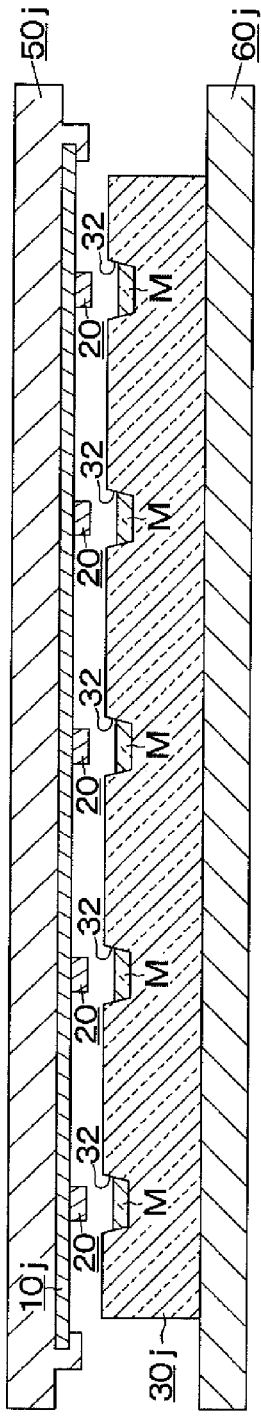
FIGS. 6A to 6C are front sectional views showing a manufacturing process of a glass-sealed LED lamp of a third embodiment.
Figure 6B:
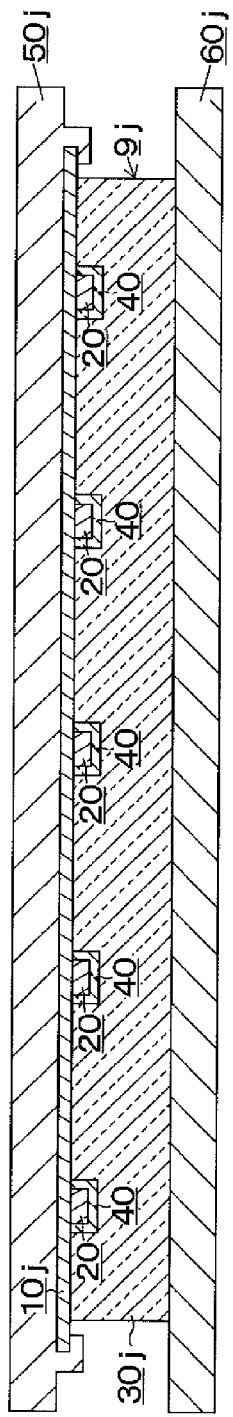
Figure 6C:
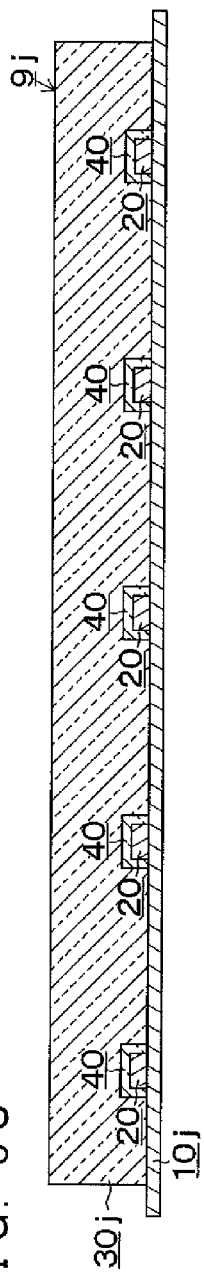
Figure 7A:
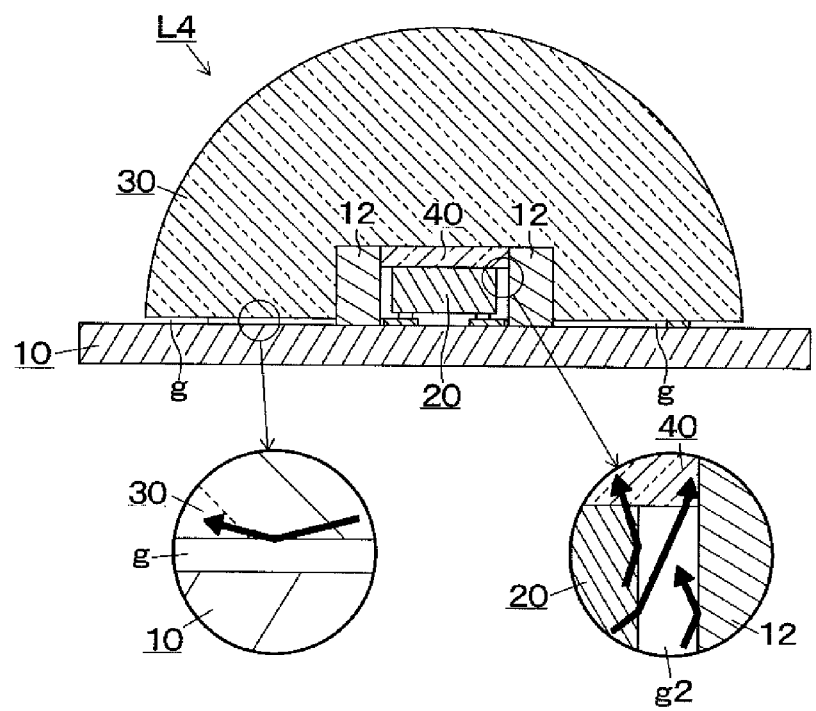
FIG. 7A is a sectional view taken along line VII(a)-VII(a) in FIG. 7B, showing a glass-sealed LED lamp of a fourth embodiment.
Figure 7B:
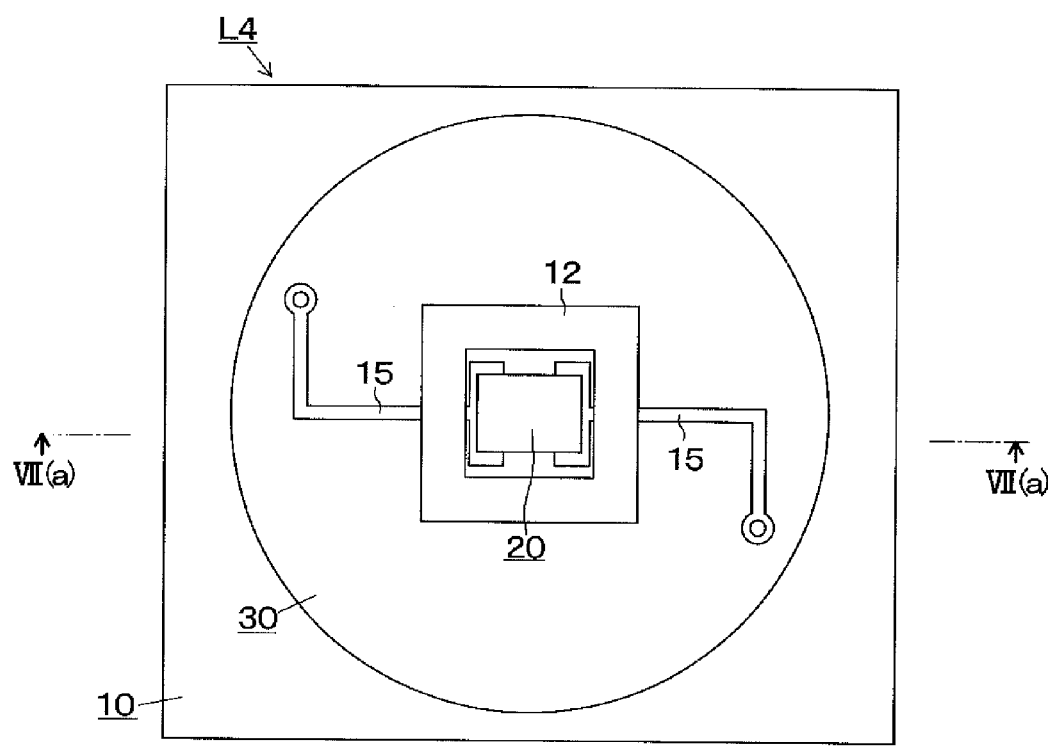
FIG. 7B is a plan view showing the glass-sealed LED lamp of the fourth embodiment.

A glass-sealed LED lamp 9j and molds (an upper mold 50j and a lower mold 60j) of a third embodiment shown in FIGS. 6A to 6C are generally the same as those of the second embodiment. However, the third embodiment is different from the second embodiment in that each of a mounting substrate 10j, a glass sealing body 30j, an upper mold 50j and a lower mold 60j is longer in the longitudinal direction and the lateral direction than that of the second embodiment, in that a plurality of LED chips 20 are mounted on the mounting substrate 10j, and in that the glass sealing body 30j is provided with a plurality of recesses 32, and each recess 32 is provided with the glass bonding portion 40, and the others are the same as the second embodiment.

According to the third embodiment, the glass-sealed LED lamp 9j in which a plurality of LED chips 20 mounted on the mounting substrate 10j are sealed with the glass sealing body 30j can be provided.

Fourth Embodiment

A glass-sealed LED lamp L4 of a forth embodiment shown in FIGS. 7A to 8B is generally the same as the glass-sealed LED lamp 9 of the first embodiment. However, the fourth embodiment is different from the first embodiment in the following points of h and i, and the others are the same as the first embodiment.

{h} A peripheral wall member 12, which is provided outward of the LED chip 20 on the upper surface of the mounting substrate 10 so as to surround the LED chip 20 and reflects light inward on an inner peripheral surface thereof, is provided. The material of the peripheral wall member 12 is alumina. The peripheral wall member 12 is provided in the recess 32 of the glass sealing body 30. The inner peripheral surface of the peripheral wall member 12 may be a vertical surface to the upper surface of the mounting substrate 10 or may be an inclined surface (a reflector structure) inclined outward from the lower side to the upper side relative to a vertical surface to the upper surface of the mounting substrate 10. FIGS. 7A to 8B show the case of the vertical surface.

{i} The glass bonding portion 40 is provided only between the upper surface of the LED chip 20 and the upper bottom surface of the recess 32, and a side clearance g2 is formed between the outer peripheral surface of the LED chip 20 and an inner peripheral surface of the peripheral wall member 12.

The manufacturing method of the glass-sealed LED lamp L4 of the fourth embodiment is generally the same as the first embodiment. However, the method is different from the first embodiment in the following points of 1-iv and 2-iv, and the other points are the same as the first embodiment.

Figure 8A:
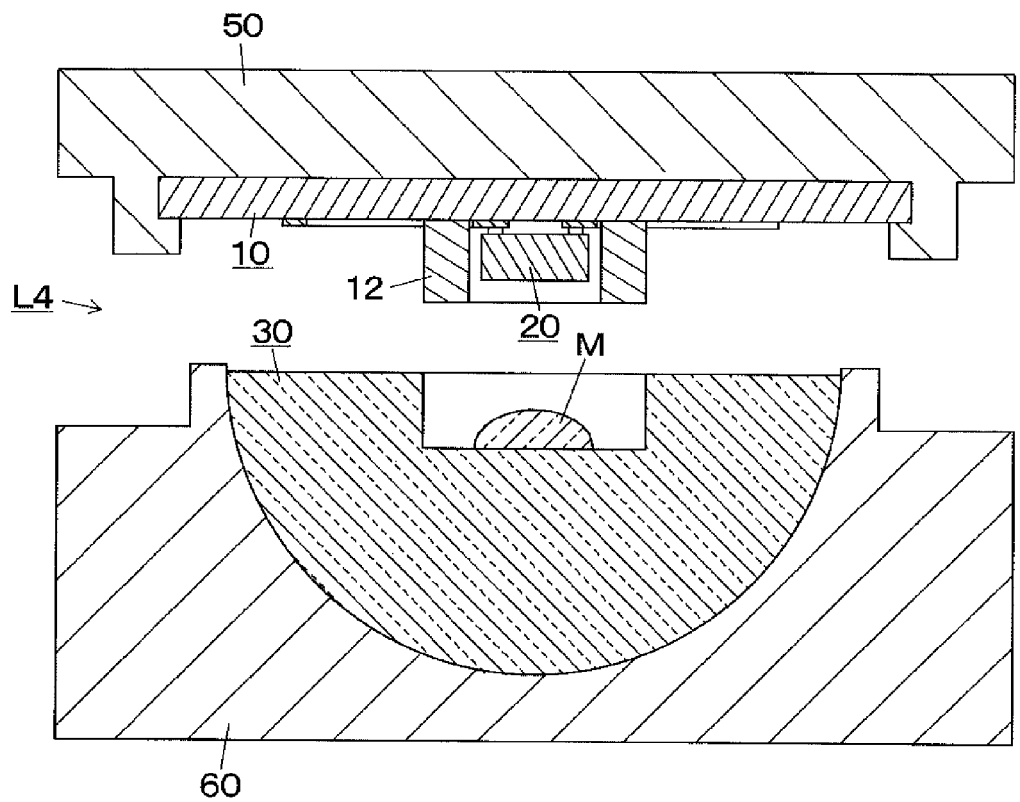
FIGS. 8A and 8B are front sectional views showing a manufacturing process of the glass-sealed LED lamp of the fourth embodiment.
Figure 8B:
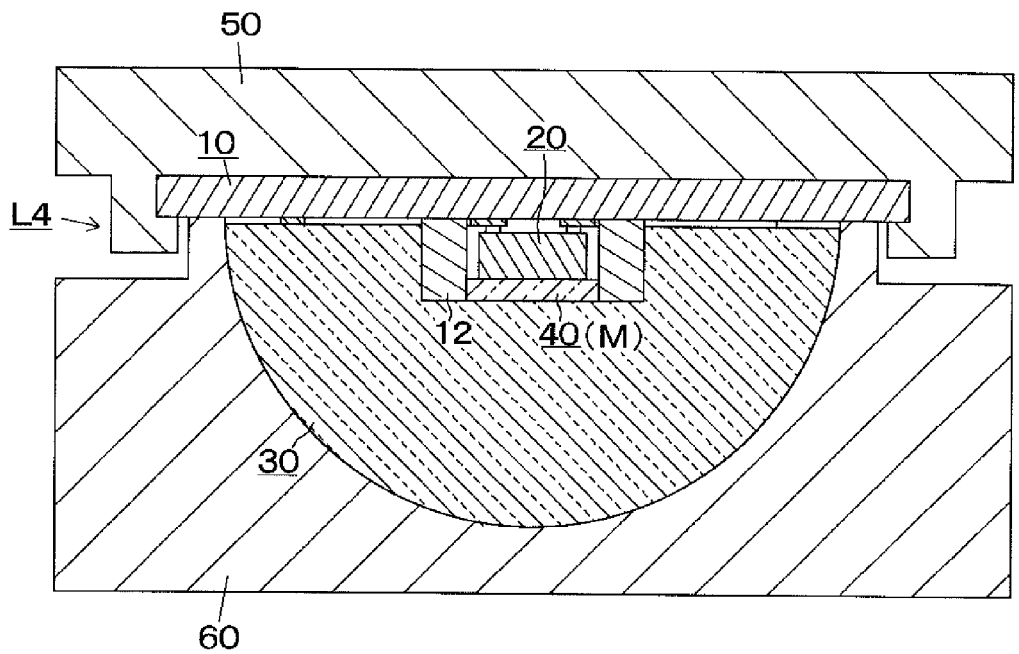

[1-iv] The LED chip 20 is mounted on the mounting substrate 10, and the peripheral wall member 12 is mounted outward of the LED chip 20 on the mounting substrate 10 as shown in FIG. 8A.

[2-iv] When the melting glass M is put into the recess 32, only a small amount of the melting glass M is put such that the melting glass M is provided only between the upper surface of the LED chip 20 and the bottom surface of the recess 32, as shown in FIG. 8A. Glass powder or plate glass with a phosphor included therein may be used as the melting glass M.

According to the fourth embodiment, the following effects H and I can be obtained in addition to the effects A to F described in the first embodiment.

[H] Providing the peripheral wall member 12 makes it possible to reflect the light emitted from the LED chip 20 in a lateral direction inward on the inner peripheral surface of the peripheral wall member 12. Thus, it is possible to efficiently emit light to the glass bonding portion 40 (a phosphor layer) located above. The light is emitted from an opening of the peripheral wall member 12 to the outside through the glass sealing body 30 located above, whereby it is possible to illuminate an upper portion in an axial direction of the glass-sealed LED lamp L4 more brightly. In addition, the glass bonding portion 40 with a phosphor mixed therein is surrounded by the peripheral wall member 12, thereby the upper surface thereof can be regarded as a light source. Therefore, an angle chromaticity distribution is reduced.

[I] Providing the side clearance g2 makes light possible to be totally reflected inward at an interface between the outer peripheral surface of the LED chip 20 and the side clearance g2. Therefore, the amount of light reaching the peripheral wall member 12 can be reduced to reduce the amount of light absorbed by and transmitted through the peripheral wall member 12. Accordingly, the extraction efficiency of the light from the glass-sealed LED lamp L4 is improved. In addition, providing the side clearance g2 makes it possible to make the peripheral wall member 12 thinner and to make an angle of the inner peripheral surface thereof smaller, whereby it is possible to make an external dimension of the glass-sealed LED lamp L4 smaller. Furthermore, the direction of the light transmitted to the side clearance g2 without being reflected at the interface between the outer peripheral surface of the LED chip 20 and the side clearance g2 is significantly shifted upward due to the difference of a refractive index. Therefore, it is possible to contribute to the improvement of the extraction efficiency of the light from the opening of the peripheral wall member 12.

Fifth Embodiment

Figure 9A:
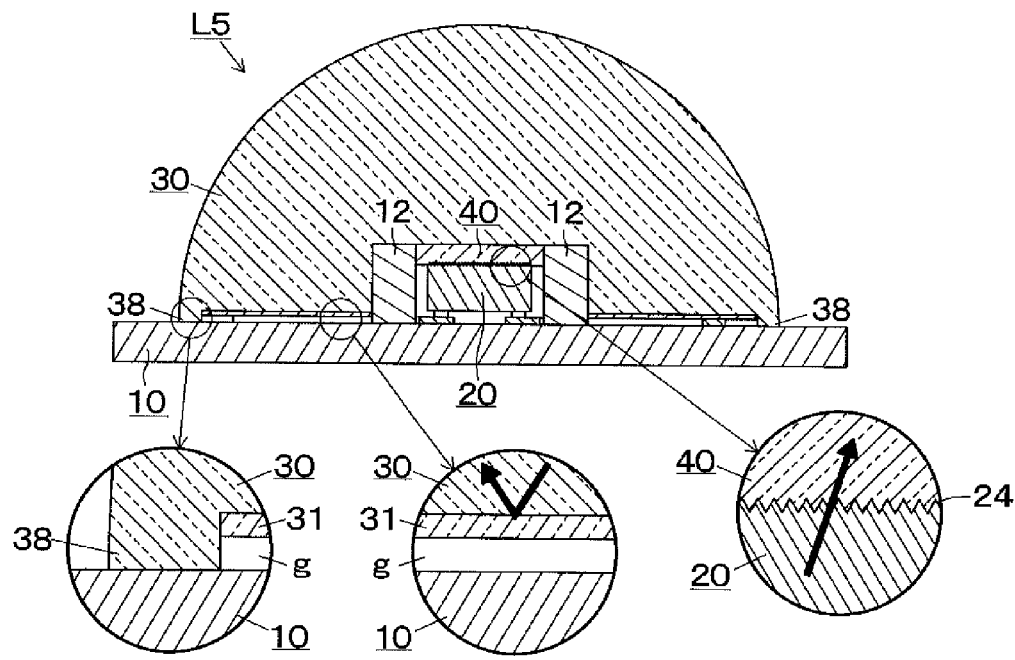
FIG. 9A is a sectional view taken along line IX(a)-IX(a) in FIG. 9B, showing a glass-sealed LED lamp of a fifth embodiment.
Figure 9B:
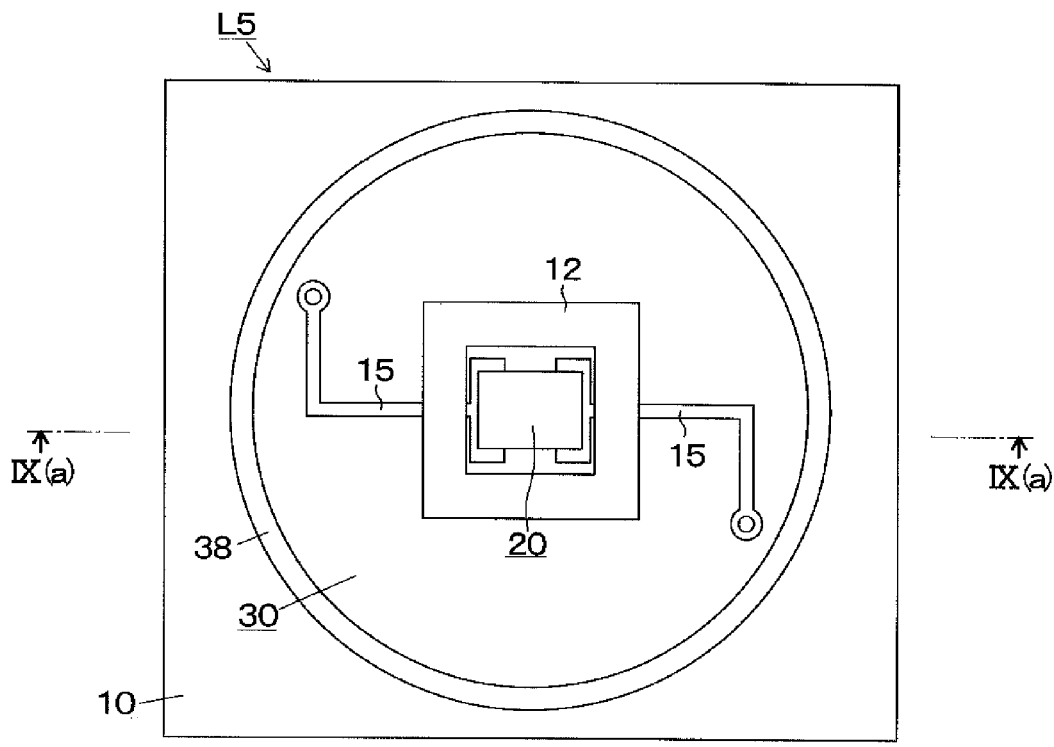
FIG. 9B is a plan view showing the glass-sealed LED lamp of the fifth embodiment.
Figure 10A:
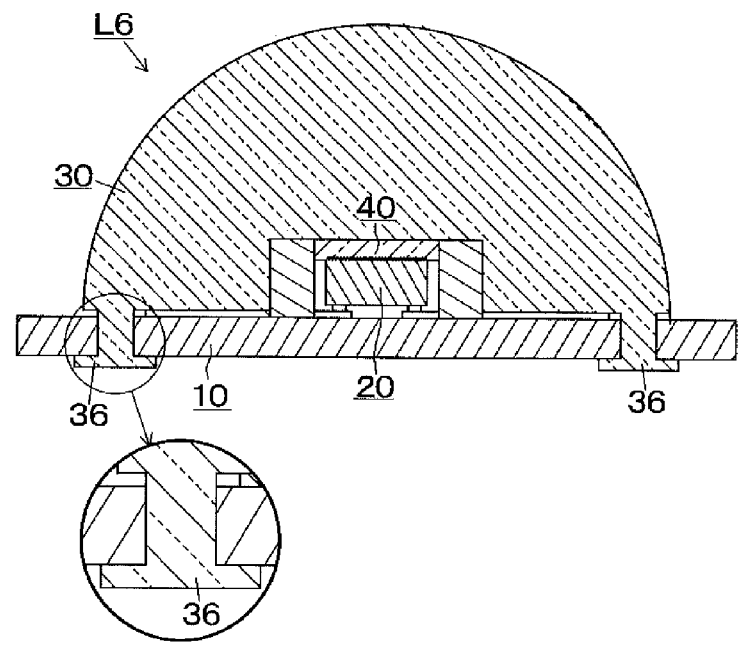
FIG. 10A is a sectional view taken along line X(a)-X(a) in FIG. 10B, showing a glass-sealed LED lamp of a sixth embodiment.
Figure 10B:
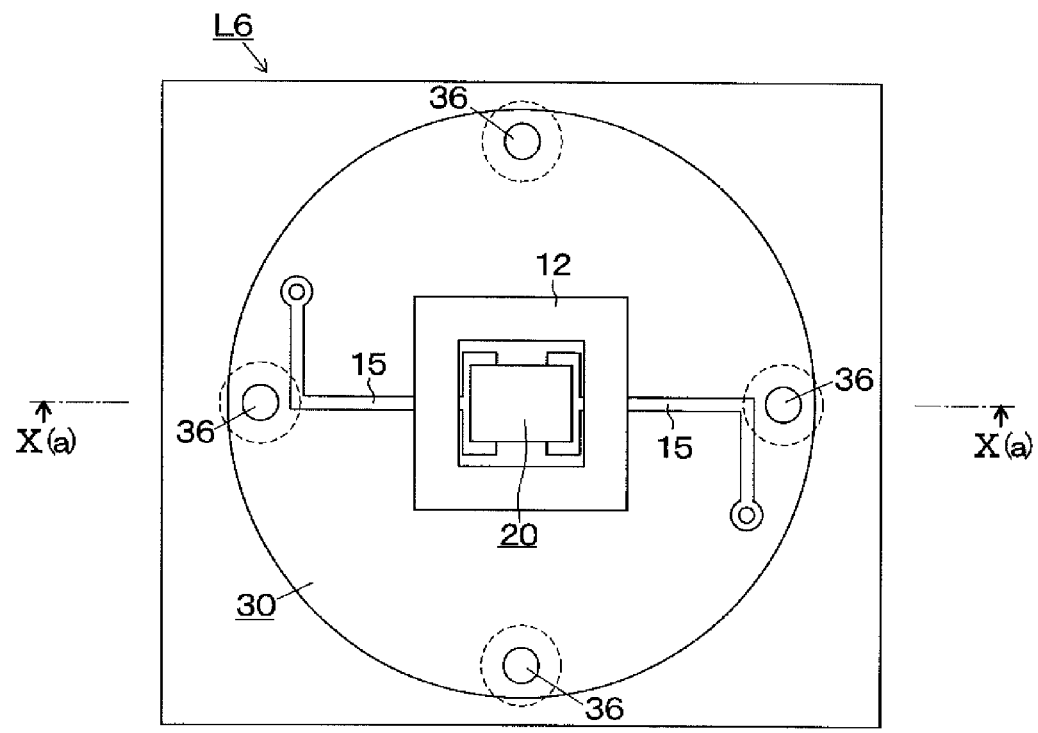
FIG. 10B is a plan view showing the glass-sealed LED lamp of the sixth embodiment.

A glass-sealed LED lamp L5 of a fifth embodiment shown in FIGS. 9A and 9B is different from the glass-sealed LED lamp L4 of the fourth embodiment in the following points j to l, and the other points are the same as the fourth embodiment.

{j} A dielectric film 31, which causes reflection, is formed on the lower surface of the glass sealing body 30 above the clearance g.

{k} A reflection suppressing structure 24, which suppresses the reflection of the light, is provided on the upper surface of the LED chip 20. The reflection suppressing structure 24 may be an anti-reflective (AR) coating using a dielectric film and may be a structure for suppressing the reflection of the light by unevenness processing.

{l} An outer end protrusion 38 protruding downward is provided on a lower surface of an outer end portion of the glass sealing body 30, and the lower surface of the outer end protrusion 38 abuts on the upper surface of the mounting substrate 10.

According to the fifth embodiment, the following effects J to L can be obtained in addition to the effects A to F described in the first embodiment and the effects H and I described in the fourth embodiment.

[J] Providing the dielectric film 31 allows the light entering at a deep angle within a range which does not cause total reflection in the clearance g to be reflected partially by the dielectric film 31.

[K] Providing the reflection suppressing structure 24 on the upper surface of the LED chip 20 allows the amount of light emitted from the upper surface of the LED chip 20 and reflected back to the LED chip 20 without being transmitted to the glass bonding portion 40 to reduce so as to improve the extraction efficiency of the light from the glass-sealed LED lamp L5.

[L] Providing the outer end protrusion 38 in the glass sealing body 30 makes it possible to easily form the clearance g between the lower surface of the glass sealing body 30 and the upper surface of the mounting substrate 10 by making the lower surface of the outer end protrusion 38 abut on the upper surface of the mounting substrate 10.

Sixth Embodiment

A glass-sealed LED lamp L6 of a sixth embodiment shown in FIGS. 10A to 11E is generally same as the glass-sealed LED lamp L5 of the fifth embodiment, and, however, is different from the fifth embodiment in the following point m, and the other points are the same as the fifth embodiment.

{m} The glass sealing body 30 is provided with engaging protrusions 36 protruding downward from the lower surface thereof, the mounting substrate 10 is provided with through holes 16. After the engaging protrusions 36 are passed through the through holes 16, lower end portions of the protrusions 36 are expanded, whereby the glass sealing body 30 engages with the mounting substrate 10. In addition, the upper mold 50 is provided with an engaging guide portion 56 guiding the engaging protrusions 36 in a direction that expands the engaging protrusions 36.

The manufacturing method of the glass-sealed LED lamp L6 of the sixth embodiment is generally same as the fifth embodiment, and, however, is different from the fifth embodiment in the following point 4-vi, and the other points are the same as the fifth embodiment.

Figure 11A:
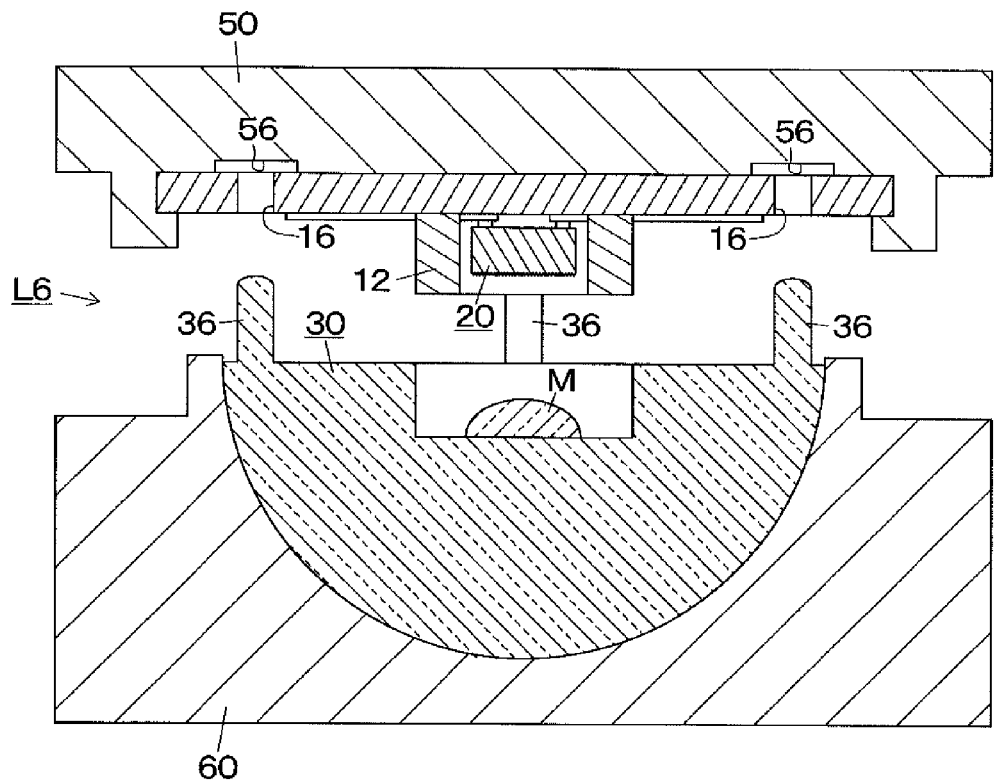
FIGS. 11A and 11B are front sectional views showing a manufacturing process of the glass-sealed LED lamp of the sixth embodiment.
Figure 11B:
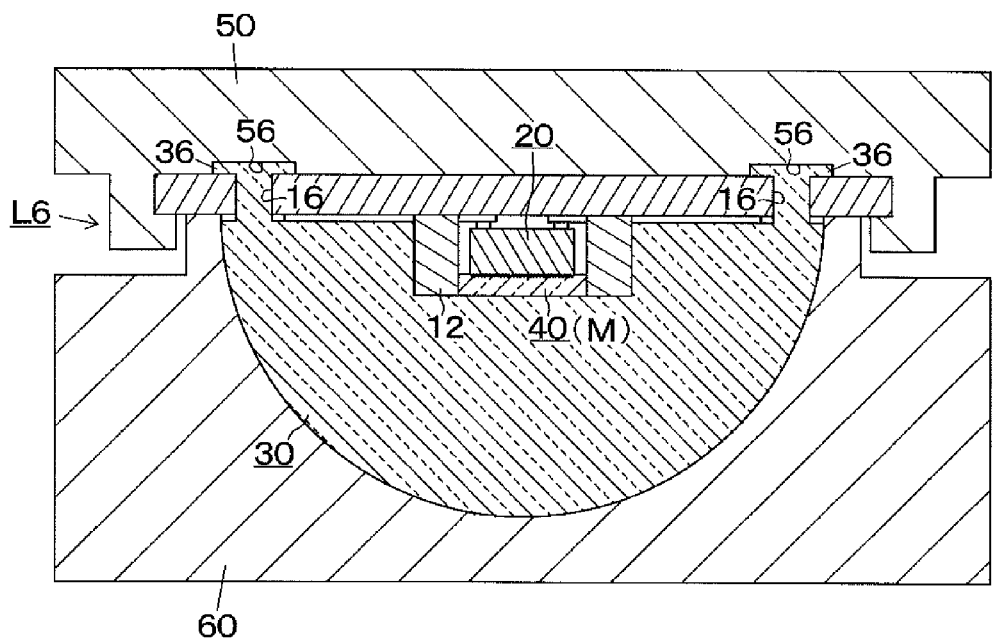

[4-vi] When the upper mold 50 in which the mounting substrate 10 has been set is placed on the lower mold 60, and pressing is performed, the engaging protrusion 36 is passed through the through holes 16, and the lower end portion of the engaging protrusions 36 passed through is pressed and expanded along the engaging guide portion 56 of the upper mold 50 as shown in FIG. 11B.

According to the sixth embodiment, the following effect M can be obtained in addition to the effects A to F described in the first embodiment, the effects H to I described in the fourth embodiment, and the effects J to L described in the fifth embodiment.

[M] Because the engaging protrusion 36 of the glass sealing body 30 is engaged with the mounting substrate 10, the bonding of the glass sealing body 30 and the mounting substrate 10 becomes strong compared to the case that the glass sealing body 30 is bonded to the mounting substrate 10 only by the glass bonding portion 40.

Seventh Embodiment

Figure 12A:
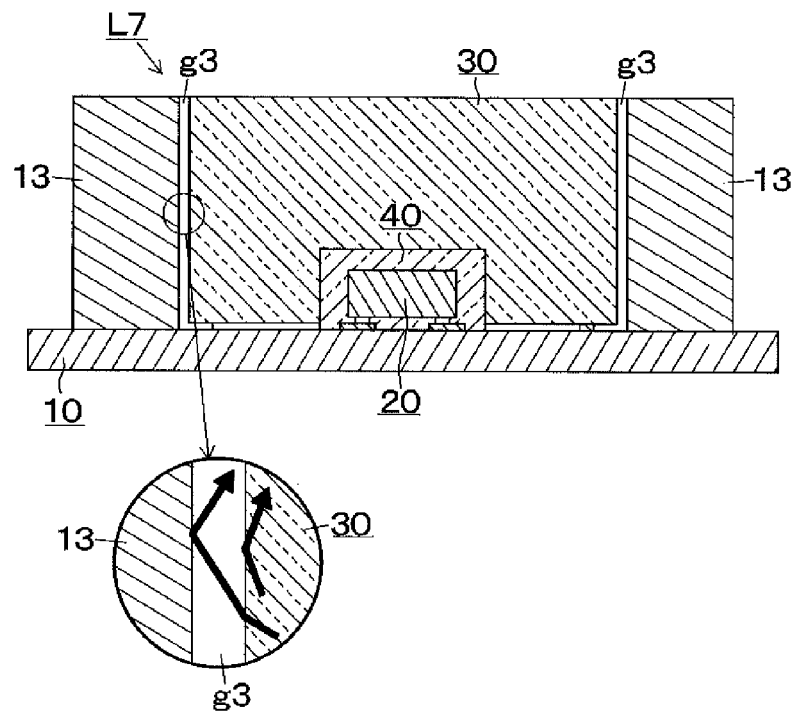
FIG. 12A is a sectional view taken along line XII(a)-XII(a) in FIG. 12B, showing a glass-sealed LED lamp of a seventh embodiment.
Figure 12B:
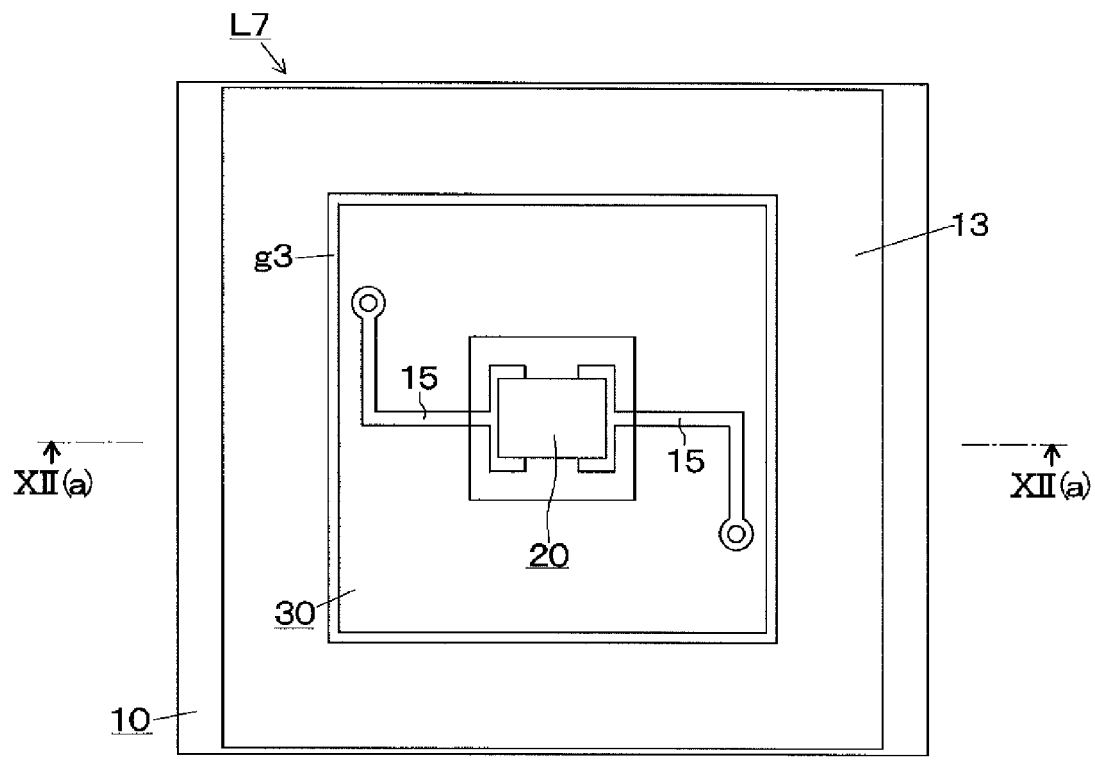
FIG. 12B is a plan view showing the glass-sealed LED lamp of the seventh embodiment.

A glass-sealed LED lamp L7 of the seventh embodiment shown in FIGS. 12A, 12B is generally same as the glass-sealed LED lamp 9i of the second embodiment, and, however, is different from the second embodiment in the following points n and o, and the other points are the same as the second embodiment.

{n} A peripheral wall member 13 surrounding the glass sealing body 30 and reflecting light inward on an inner peripheral surface thereof is mounted outward of the glass sealing body 30 on the mounting substrate 10. The material of the peripheral wall member 13 is white silicone resin with TiO$_2$ powder included in silicone resin. In addition, the inner peripheral surface of the peripheral wall member 13 may be a vertical surface to the upper surface of the mounting substrate 10 or may be an inclined surface (a reflector structure) inclined outward from a lower side to an upper side relative to a vertical surface to the upper surface of the mounting substrate 10. FIGS. 12A, 12B show the case of the vertical surface.

{o} A side clearance g3 which causes total reflection at an interface between the outer peripheral surface of the glass sealing body 30 and the side clearance g3 is formed between the outer peripheral surface of the glass sealing body 30 and the inner peripheral surface of the peripheral wall member 13.

According to the seventh embodiment, the following effects N and O can be obtained in addition to the effects A to G of the first embodiment.

[N] Providing the peripheral wall member 13 makes it possible to reflect the light emitted from the LED chip 20 through the glass sealing body 30 in a lateral direction inward on the inner side surface of the peripheral wall member 13. Accordingly, it is possible to emit light to the opening of the peripheral wall member 13 located above more efficiently. Therefore, it is possible to illuminate an upper side in an axial direction of the glass-sealed LED lamp L7 more brightly.

[O] Providing the side clearance g3 makes it possible to reflect light totally inward at an interface between the outer peripheral surface of the LED chip 20 and the side clearance g3. Therefore, it is possible to reduce the amount of the light reaching the peripheral wall member 13 to reduce the amount of the light absorbed in and transmitted through the peripheral wall member 13. Accordingly, the extraction efficiency of the light from the glass-sealed LED lamp L7 is improved. In addition, providing the side clearance g3 makes it possible to make the peripheral wall member 13 thinner and to make the angle of the inner peripheral surface thereof smaller, thereby making an external dimension of the glass-sealed LED lamp L7 smaller. Furthermore, the direction of the light transmitted to the side clearance g3 without being reflected at the interface between the outer peripheral surface of the glass sealing body 30 and the side clearance g3 is significantly shifted upward due to the difference of a refractive index. Therefore, it is possible to contribute to the improvement of the extraction efficiency of the light from the opening of the peripheral wall member 13.

Eighth Embodiment

Figure 13A:
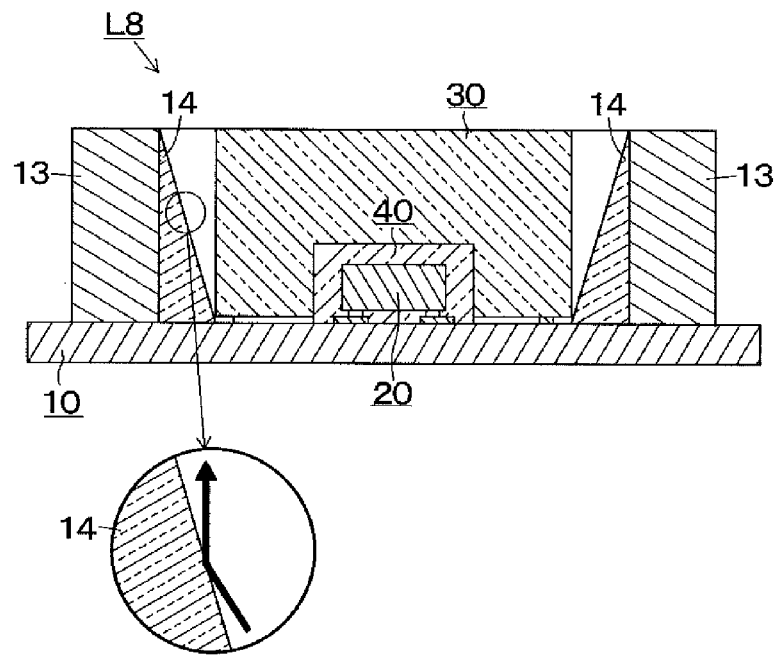
FIG. 13A is a sectional view taken along line XIII(a)-XIII(a) in FIG. 13B, showing a glass-sealed LED lamp of an eighth embodiment.
Figure 13B:
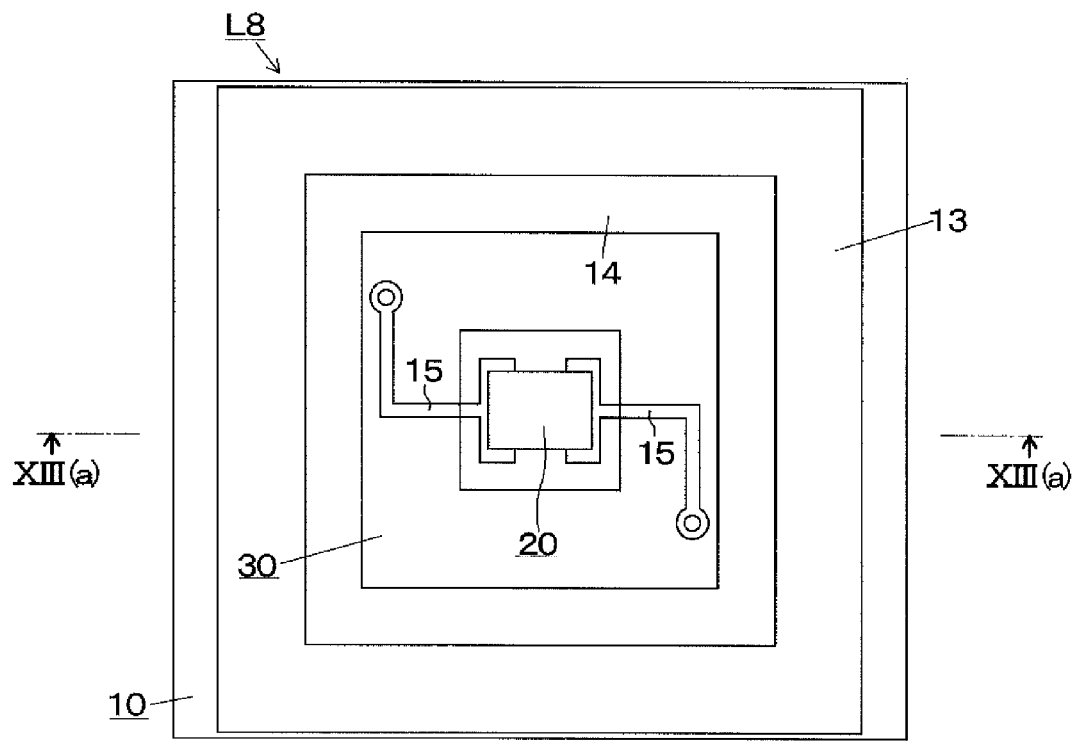
FIG. 13B is a plan view showing the glass-sealed LED lamp of the eighth embodiment.
Figure 14A:
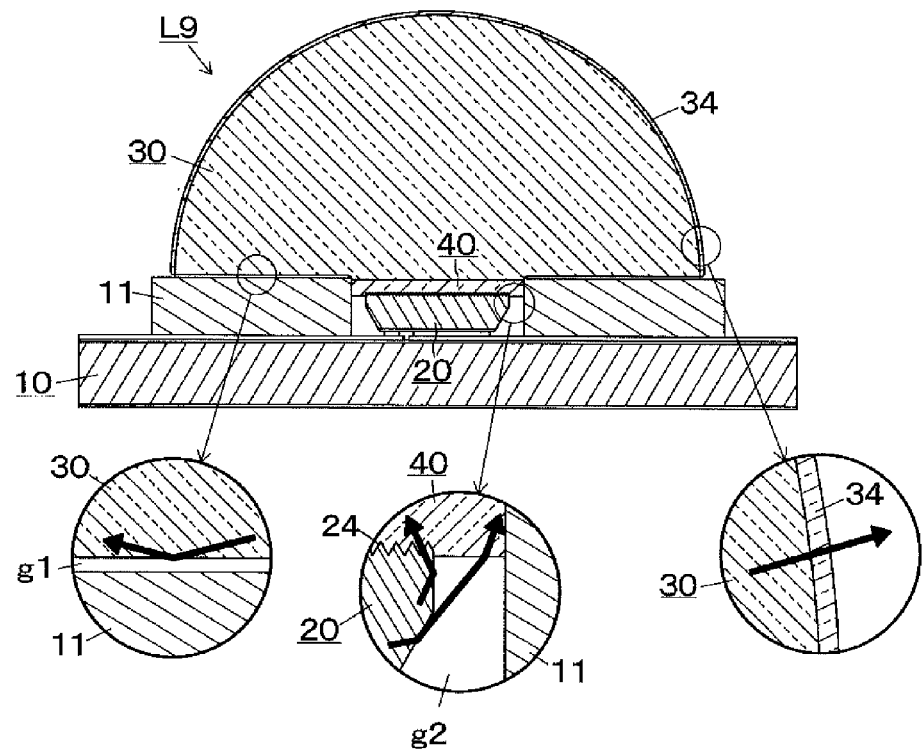
FIG. 14A is a sectional view taken along line XIV(a)-XIV(a) in FIG. 14B, showing a glass-sealed LED lamp of a ninth embodiment.
Figure 14B:
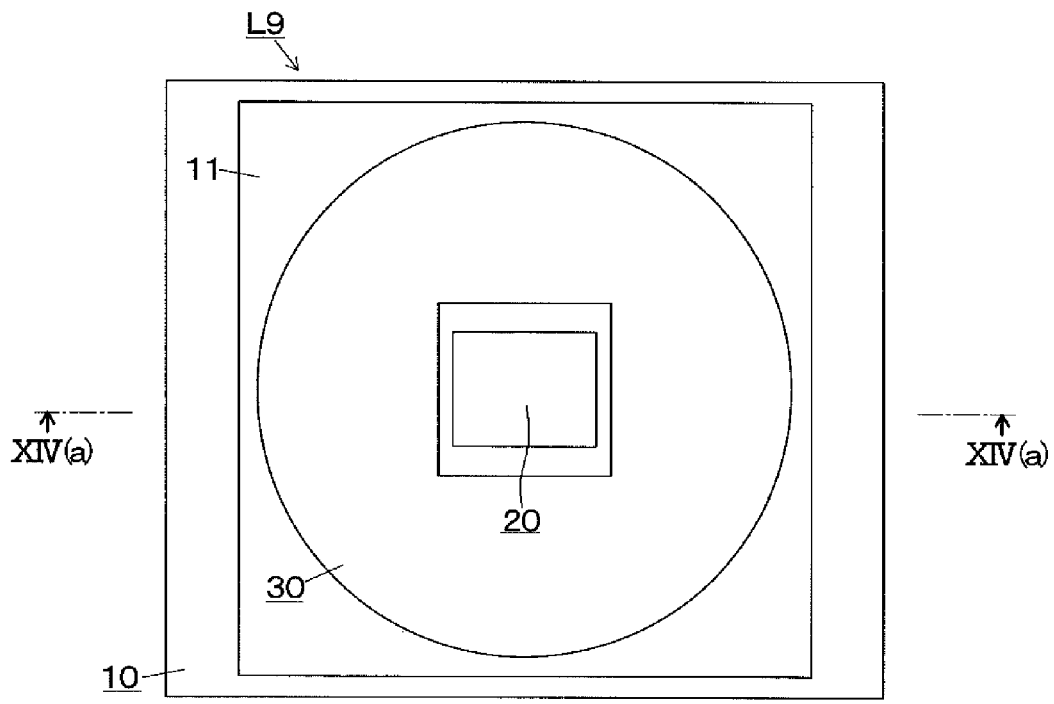
FIG. 14B is a plan view showing the glass-sealed LED lamp of the ninth embodiment.

A glass-sealed LED lamp L8 of an eighth embodiment shown in FIG. 13 is generally same as the glass-sealed LED lamp L7 of the seventh embodiment, and, however, is different from the seventh embodiment in the following point p, and the other points are the same as the seventh embodiment.

{p} A white reflector 14 made of white resin or white glass is formed on an inner peripheral surface of the peripheral wall member 13. An inner peripheral surface of the white reflector 14 may be a vertical surface to the upper surface of the mounting substrate 10 or may be an inclined surface (a reflector structure) inclined outward from a lower side to an upper side relative to a vertical surface to the upper surface of the mounting substrate 10. FIG. 13 shows the case of the inclined surface.

According to the eighth embodiment, the following effect P can be obtained in addition to the effects A to F described in the first embodiment and the effects N and O described in the seventh embodiment.

[P] Forming the white reflector 14 on the inner peripheral surface of the peripheral wall member 13 makes it possible to reflect light inward more efficiently.

Ninth Embodiment

A glass-sealed LED lamp L9 of a ninth embodiment shown in FIGS. 14A to 15B is different from the first embodiment in the following point a' to f', and the other points are the same as the first embodiment.

{a'} A peripheral wall member 11 surrounding the LED chip 20 and reflecting light inward on the inner peripheral surface thereof is mounted outward of the LED chip 20 on the mounting substrate 10, and the glass sealing body 30 is mounted on the peripheral wall member 11. The material of the peripheral wall member 11 is alumina. In addition, an inner peripheral surface of the peripheral wall member 11 may be a vertical surface to the upper surface of the mounting substrate 10 or may be an inclined surface (a reflector structure) inclined outward from a lower side to an upper side relative to a vertical surface to the upper surface of the mounting substrate 10. FIGS. 14A to 15B show the cases of the vertical surface.

{b'} A clearance g1, which causes total reflection at an interface between the lower surface of the glass sealing body 30 and the clearance g1, is provided between the lower surface of the glass sealing body 30 and an upper surface of the peripheral wall member 11.

{c'} The glass bonding portion 40 is provided only between the upper surface of the LED chip 20 and the bottom surface of the recess 32, and a side clearance g2 is formed between the outer peripheral surface of the LED chip 20 and the inner peripheral surface of the peripheral wall member 11.

{d'} The glass sealing body 30 is provided with a protrusion 33 instead of the recess 32. The protrusion 33 protrudes downward from a central portion and has an outer peripheral surface that is smaller than an inner peripheral surface of the peripheral wall member 11. The lower surface of the protrusion 33 is bonded to the upper surface of the LED chip 20 through the glass bonding portion 40.

{e'} The reflection suppressing structure 24 for suppressing the reflection of the light is provided on the upper surface of the LED chip 20. The reflection suppressing structure 24 may be an AR coating using a dielectric film or may be a structure for suppressing the reflection of the light by unevenness processing.

{f'} An anti-reflective coating 34 is provided on the outer peripheral surface of the glass sealing body 30 in a semispherical shape.

The glass-sealed LED lamp L9 of the ninth embodiment is manufactured in the following procedures [1'] to [5'].

Figure 15A:
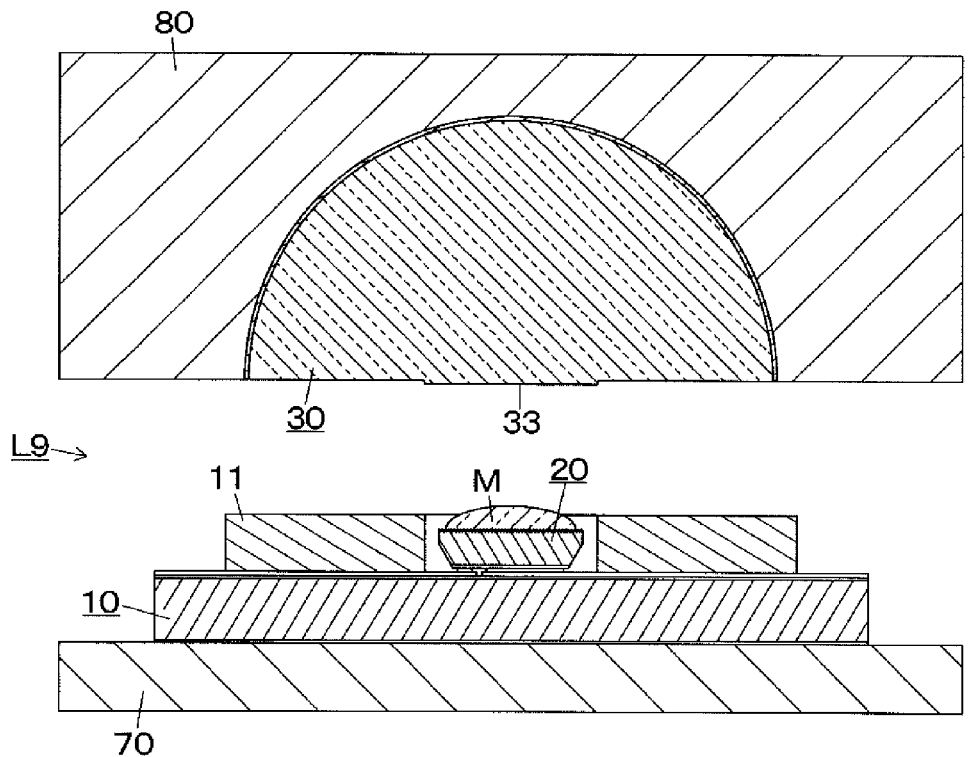
FIGS. 15A and 15B are front sectional views showing a manufacturing process of the glass-sealed LED lamp of the ninth embodiment.

[1'] First, as shown in FIG. 15A, the LED chip 20 is mounted on the mounting substrate 10 and a peripheral wall member 11 is mounted outward of the LED chip 20 on the mounting substrate 10 to form the side clearance g2 between the LED chip 20 and the peripheral wall member 11. Then, the mounting substrate 10 is set to a lower mold 70.

[2'] As shown in FIG. 15A, the glass sealing body 30 is set in an upper mold 80 whose molding surface is in a semispherical shape.

[3'] Next, powdered glass for melting M (phosphate glass or bismuth oxide glass) whose yielding point is lower than that of the glass sealing body 30 (zinc oxide glass or borosilicate glass) is heated and softened, and the heated and softened glass is put in an opening of the peripheral wall member 11. Phosphor powder or microcrystalline phosphor is mixed in the melting glass M. The melting glass M may be plate glass or powdered glass. As a heating temperature at this time, a temperature in which the melting glass M is sufficiently softened but the glass sealing body 30 is not softened, that is, a temperature that is higher than the yielding point of the melting glass M and is lower than the yielding point of the glass sealing body 30, is selected. More specifically, a temperature near the melting point of the melting glass M in a range from the glass transition point to near the yielding point of the glass sealing body 30 may be selected.

Figure 15B:
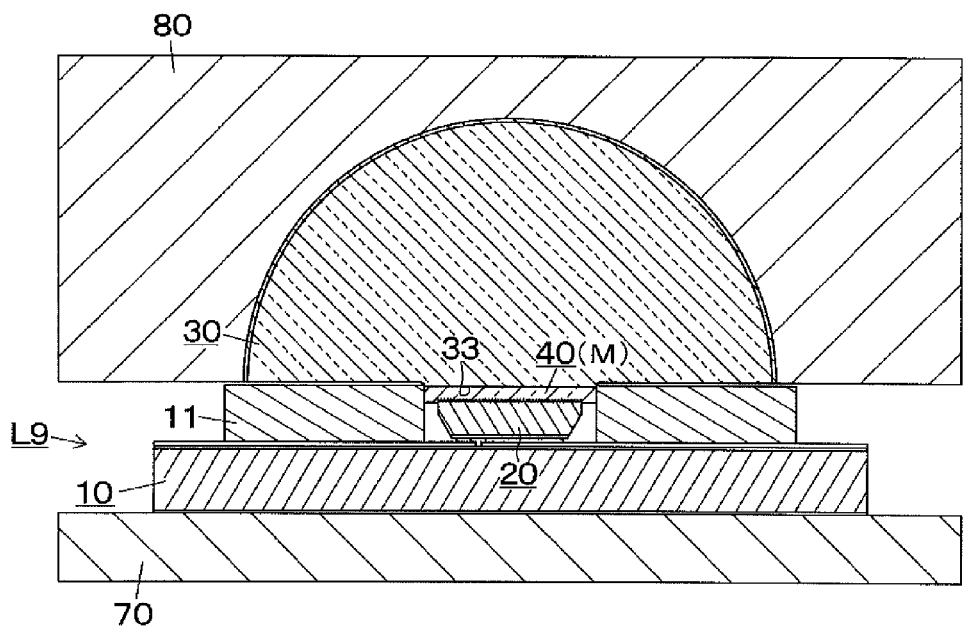

[4'] Next, as shown in FIG. 15B, a pressing is conducted by placing the upper mold 80 in which the glass sealing body 30 has been set, on the lower mold 70. Thereby, the lower surface of the protrusion 33 of the glass sealing body 30 is pressed against melting glass M. Thereby, the lower surface of the protrusion 33 of the glass sealing body 30 is fusion-bonded to the upper surface of the LED chip 20 through the melting glass M (the glass bonding portion 40), and the clearance g1 is formed between the upper surface of the peripheral wall member 11 and the lower surface of the glass sealing body 30. As described above, the glass-sealed LED lamp L9 which includes the mounting substrate 10, the LED chip 20, the glass sealing body 30, and the glass bonding portion 40 is formed inside of a mold which includes the upper mold 80 and the lower mold 70.

[5] Next, the upper mold 80 is opened against the lower mold 70. Then, the glass-sealed LED lamp L9 shown in FIG. 13 is obtained.

According to the glass-sealed LED lamp L9 of the ninth embodiment, the following effects [A'] to [F'] can be obtained in addition to the effects [B], [D], and [F] described in the first embodiment.

[A'] Providing the peripheral wall member 11 makes it possible to reflect the light emitted from the LED chip 20 in a lateral direction inward on an inner peripheral surface of the peripheral wall member 11. Thus, it is possible to emit light efficiently to the glass bonding portion 40 (the phosphor layer) located above. The light is emitted from an opening of the peripheral wall member 11 to the outside through the glass sealing body 30 located above, whereby it is possible to illuminate an upper portion in an axial direction of the glass-sealed LED lamp L9 more brightly. In addition, the glass bonding portion 40 with a phosphor mixed therein is surrounded by the peripheral wall member 11, thereby the upper surface thereof can be regarded as a light source. Therefore, an angle chromaticity distribution is reduced.

[B'] The clearance g1 is provided between the lower surface of the glass sealing body 30 and the upper surface of the peripheral wall member 11. Therefore, among the light proceeding to the clearance g1, a portion of the light, which is incident to the interface between the glass sealing body 30 and the clearance g1 at an incident angle of less than a critical angle of total reflection, is transmitted to the clearance g1 without being reflected and reaches the upper surface of the peripheral wall member 11. However, the light incident to the interface with an incident angle of the critical angle or more is not transmitted to the clearance g1 and is totally reflected. Thus, it is possible to improve the extraction efficiency from the glass sealing body 30 of the light emitted from the LED chip 20 by reducing the amount of the light which reaches the upper surface of the peripheral wall member 11 and is absorbed by the peripheral wall member 11.

[C'] Providing the side clearance g2 allows light to be totally reflected inward at an interface between the outer peripheral surface of the LED chip 20 and the side clearance g2. Therefore, the amount of the light reaching the peripheral wall member 11 can be reduced to reduce the amount of the light absorbed by and transmitted through the peripheral wall member 11, whereby the extraction efficiency of the light from the glass-sealed LED lamp L9 is improved. In addition, providing the side clearance g2 makes it possible to make the peripheral wall member 11 thinner and to make the angle of the inner peripheral surface thereof smaller, whereby it is possible to reduce the external dimensions of the glass-sealed LED lamp L9. Furthermore, the direction of the light transmitted to the side clearance g2 without being reflected at the interface between the outer peripheral surface of the LED chip 20 and the side clearance g2 is significantly shifted upward due to the difference of a refractive index. Therefore, it is possible to contribute to the improvement of the extraction efficiency of the light from the opening of the peripheral wall member 11.

[D'] Providing the protrusion 33 on the lower surface of the glass sealing body 30 makes it possible to easily press the glass sealing body 30 against the melting glass M by inserting the protrusion 33 into the opening of the peripheral wall member 11 with the melting glass M put therein.

[E'] Because the reflection suppressing structure 24 is provided on the upper surface of the LED chip 20, the amount of light emitted from the upper surface of the LED chip 20 and reflected back to the LED chip 20 without being transmitted to the glass bonding portion 40 can be reduced to increase the extraction efficiency of the light from the whole glass-sealed LED lamp L9.

[F'] Because the anti-reflective coating 34 is provided on the outer peripheral surface of the glass sealing body 30, the amount of light reflected back to the glass sealing body 30 without being transmitted through the outer peripheral surface of the glass sealing body 30 to the outside can be reduced to increase the extraction efficiency of the light from the whole glass-sealed LED lamp L9.

Tenth Embodiment

Figure 16A:
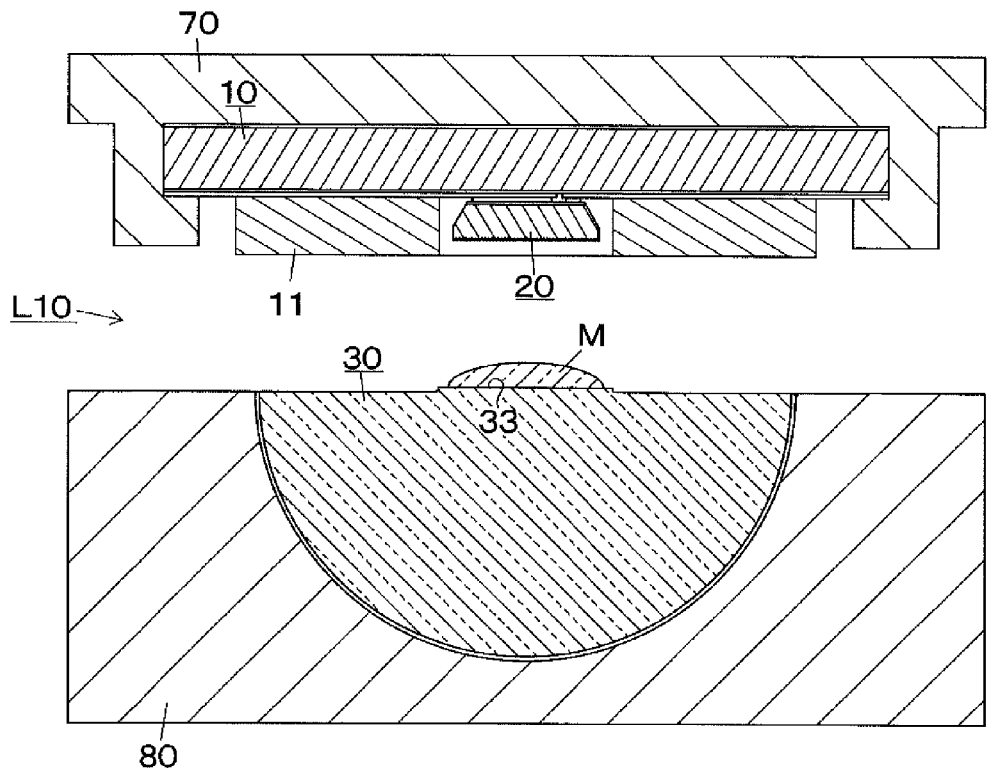
FIGS. 16A and 16B are front sectional views showing a manufacturing process of a glass-sealed LED lamp of a tenth embodiment.
Figure 16B:
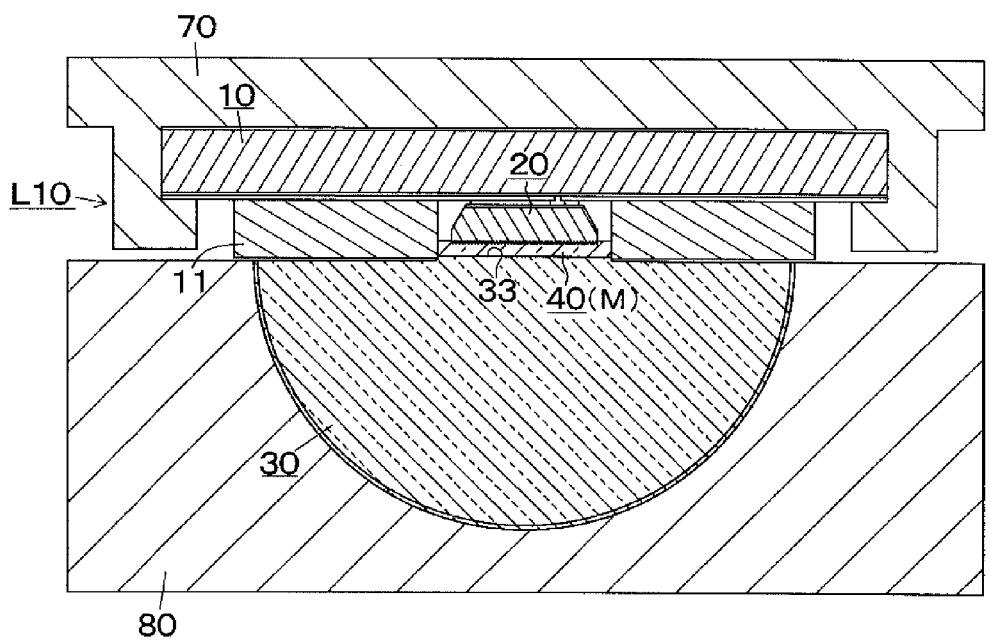

A glass-sealed LED lamp L10 of a tenth embodiment shown in FIGS. 16A and 16B is the same as the glass-sealed LED lamp L9 of the ninth embodiment and, however, the manufacturing method is different from the ninth embodiment in the following point 3-x, and the other points are the same as the ninth embodiment.

[3-x] The melting glass M is heated and softened, and then the heated and softened glass is bonded to the lower surface of the protrusion of the glass sealing body 30, as shown in FIG. 16A, instead of putting the heated and the softened glass for melting M into the opening of the peripheral wall member 11. In the tenth embodiment, the position of the upper mold and lower mold may be reversed when there is a possibility that the melting glass M may drop downward from the lower surface of the protrusion 33. FIG. 16 shows the case where the position of the upper mold and the lower mold is reversed.

According to the tenth embodiment, the effects B, D, and F described in the first embodiment and the effects A' to F' described in the ninth embodiment can be also obtained.

Eleventh Embodiment

Figure 17A:
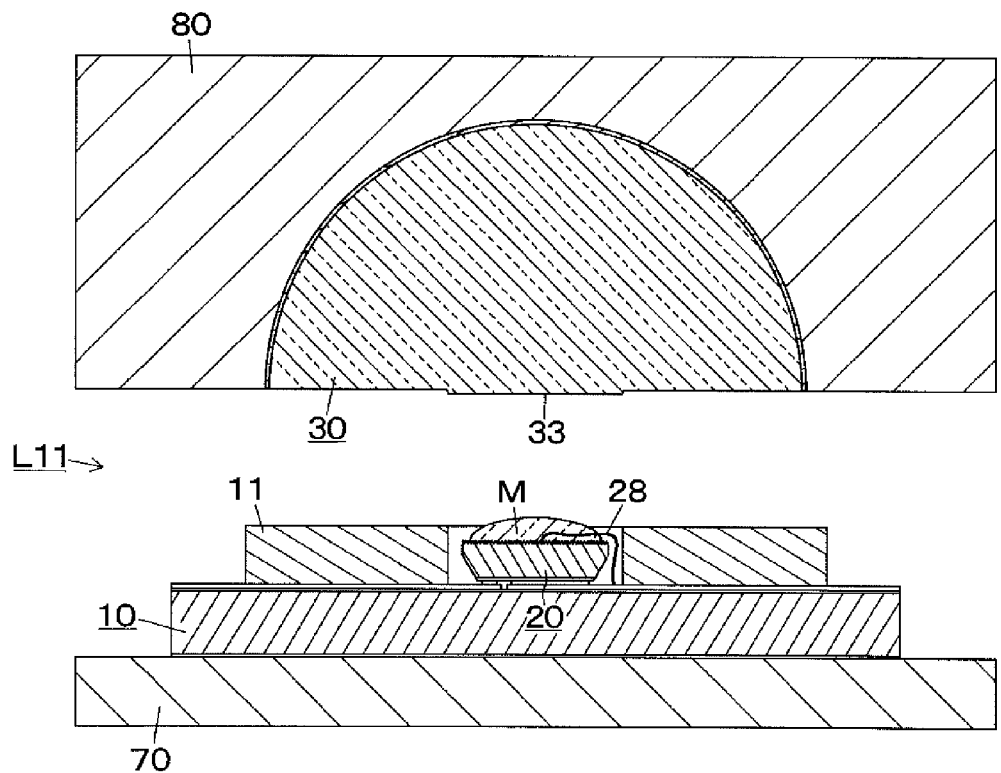
FIGS. 17A and 17B are front sectional views showing a manufacturing process of a glass-sealed LED lamp of an eleventh embodiment.
Figure 17B:
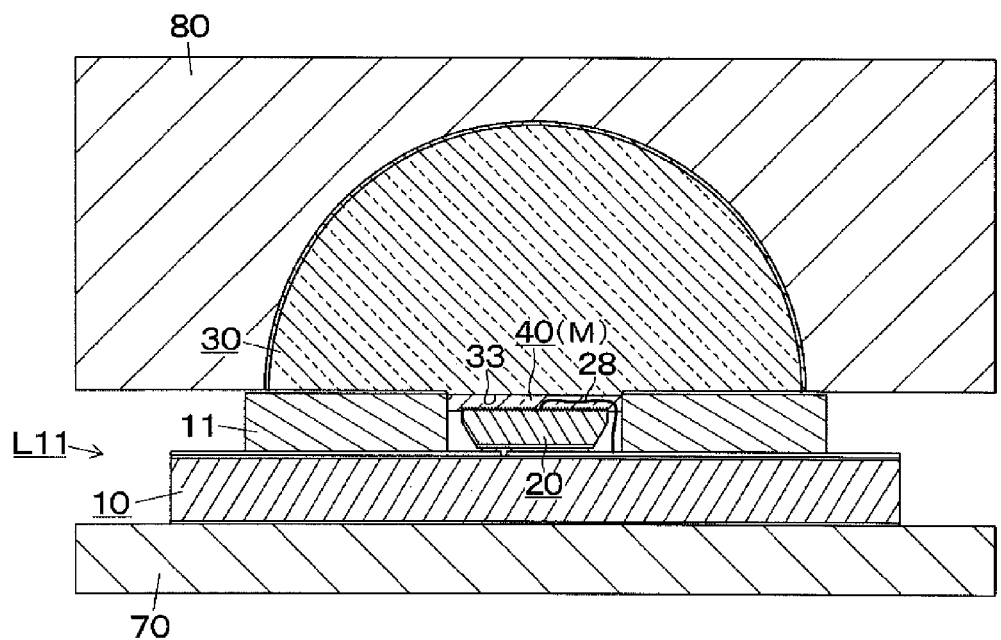

A glass-sealed LED lamp L11 of an eleventh embodiment shown in FIGS. 17A, 17B is generally same as the glass-sealed LED lamp L9 of the ninth embodiment, and, however, is different from the ninth embodiment in the following point g, and the other points are the same as the ninth embodiment.

{g} A metal wire 28 for supplying electricity and the like to the LED chip 20 is passed inside the glass bonding portion 40. In this case, it is preferable to use the mixed powder of a phosphor and glass as the melting glass M (glass bonding portion 40). However, the melting glass M is not limited to the mixed powder as long as it has a structure to secure insulation and the like even when the metal wire 28 is crushed.

According to the eleventh embodiment, the following effect G' can be obtained in addition to the effects B, D, and F described in the first embodiment and the effects A' to F' described in the ninth embodiment.

[G] Because the metal wires 28 are passed inside the glass bonding portion 40, the wiring of the LED chip 20 becomes simple.

Twelfth Embodiment

Figure 18A:
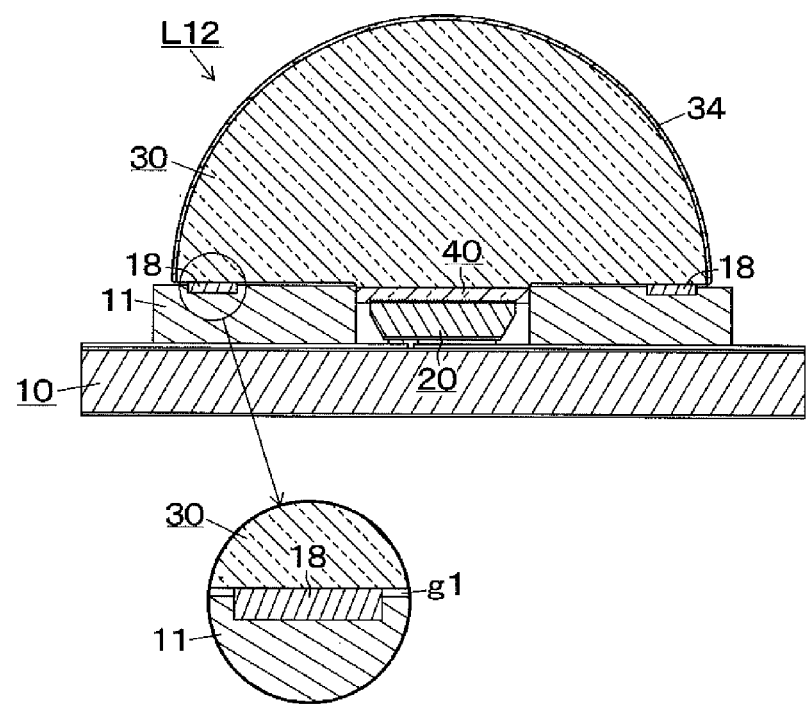
FIG. 18A is a sectional view taken along line XVIII(a)-XVIII(a) in FIG. 18B, showing a glass-sealed LED lamp of a twelfth embodiment.
Figure 18B:
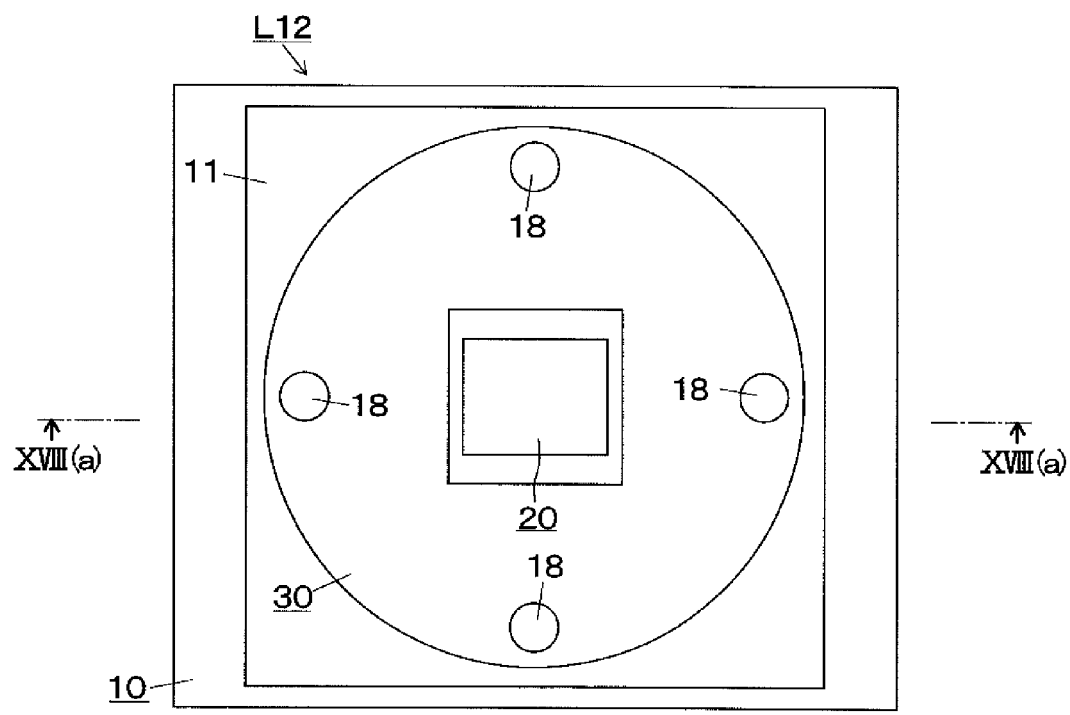
FIG. 18B is a plan view showing the glass-sealed LED lamp of the twelfth embodiment.
Figure 19A:
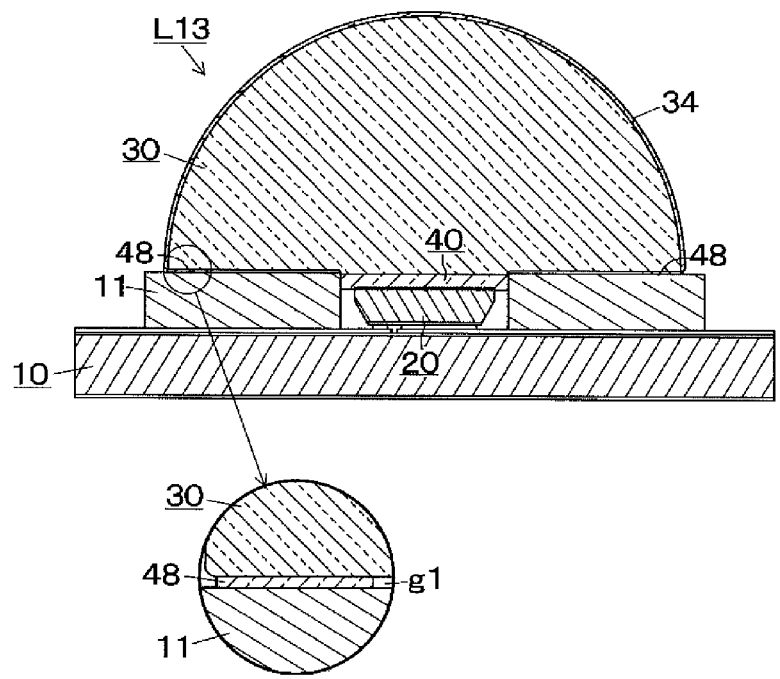
FIG. 19A is a sectional view taken along line XIX(a)-XIX(a) in FIG. 19B, showing a glass-sealed LED lamp of a thirteenth embodiment.
Figure 19B:
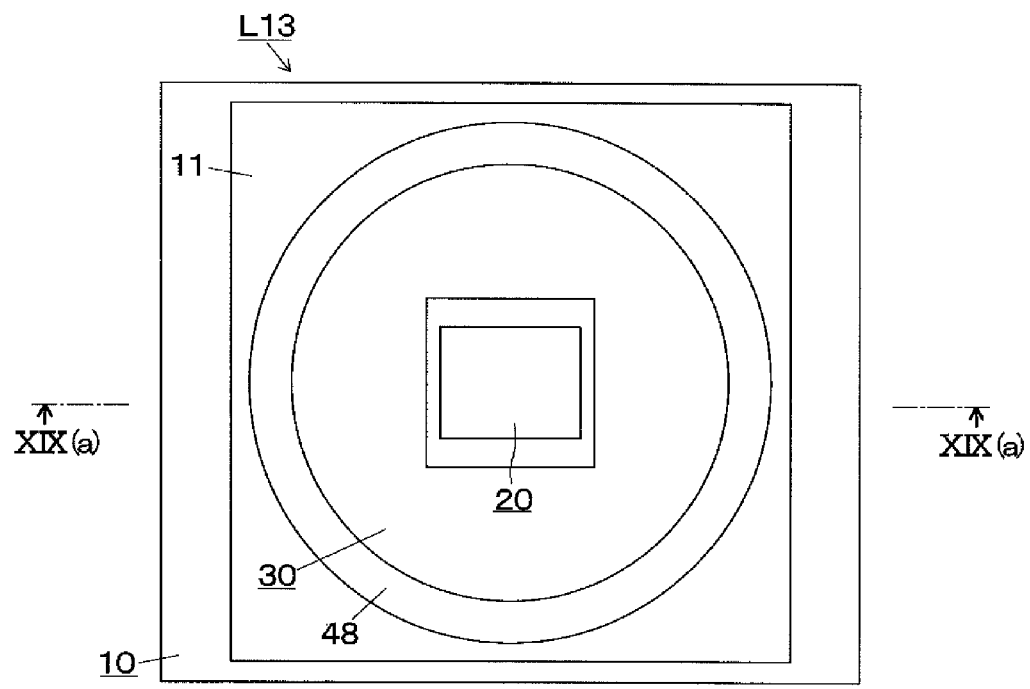
FIG. 19B is a plan view showing the glass-sealed LED lamp of the thirteenth embodiment.
Figure 21A:
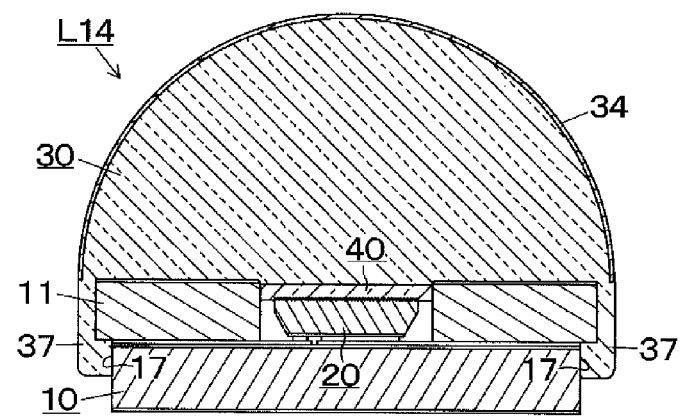
FIG. 21A is a sectional view taken along line XXI(a)-XXI(a) in FIG. 21B, showing a glass-sealed LED lamp of a fourteenth embodiment.
Figure 21B:
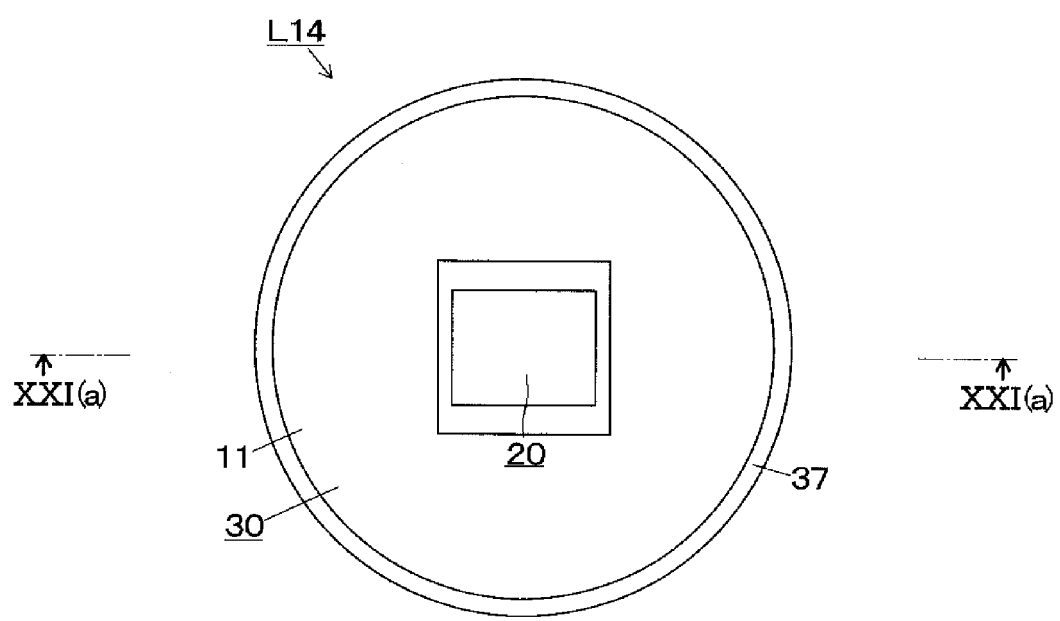
FIG. 21B is a plan view showing the glass-sealed LED lamp of the fourteenth embodiment.

A glass-sealed LED lamp L12 of a twelfth embodiment shown in FIGS. 18A, 18B is generally same as the glass-sealed LED lamp L9 of the ninth embodiment, and, however, is different from the ninth embodiment in the following point h', and the other points are the same as the ninth embodiment.

{h'} Peripheral wall protrusions 18 protruding upward are provided on the upper surface of the peripheral wall member 11, and upper surfaces of the peripheral wall protrusions 18 abut on the lower surface of the glass sealing body 30.

According to the twelfth embodiment, the following effect H' can be obtained in addition to the effects B, D, and F described in the first embodiment and the effects A' to F' described in the ninth embodiment.

[H'] The upper surfaces of the peripheral wall protrusion 18 abut on the lower surface of the glass sealing body 30. Therefore, it is possible to form the clearance g1 easily between the lower surface of the glass sealing body 30 and the upper surface of the peripheral wall member 11.

Thirteenth Embodiment

A glass-sealed LED lamp L13 of a thirteenth embodiment shown in FIGS. 19A to 20B is generally same as the glass-sealed LED lamp L9 of the ninth embodiment, and, however, is different from the ninth embodiment in the following point i', and the other points are the same as the ninth embodiment.

{i'} An outside glass bonding portion 48 by which an outer peripheral end portion of the glass sealing body 30 is bonded to the upper surface of the peripheral wall member 11 is provided.

The manufacturing method of the glass-sealed LED lamp L13 of the thirteenth embodiment is generally same as the ninth embodiment, and, however, is different in the following point 3-xiii from the ninth embodiment, and the other points are the same as the ninth embodiment.

[3-xiii] When the melting glass M is heated and softened, and the heated and softened glass M is put in the opening of the peripheral wall member 11, the heated and softened glass M for melting is also provided in a portion of the upper surface of the peripheral wall member 11 opposite to the outer peripheral end portion of the lower surface of the glass sealing body 30, as shown in FIG. 20A.

According to the thirteenth embodiment, the following effect I' can be obtained in addition to the effects B, D, and F described in the first embodiment and the effects A' to E' described in the ninth embodiment.

[I'] Because the glass sealing body 30 and the peripheral wall member 11 are bonded by the outside glass bonding portion 48, the bonding of the glass sealing body 30 and the peripheral wall member 11 becomes stronger compared to the case where the glass sealing body 30 and the peripheral wall member 11 are bonded by only the central glass bonding portion 40. In addition, the clearance g1 can be easily formed between the lower surface of the glass sealing body 30 and the upper surface of the peripheral wall member 11. The outside glass bonding portion 48 may be arranged circumferentially to be formed in a shape to seal the clearance g1, and the vacuum forming is performed. Accordingly, the clearance g1 is made in vacuum, and the glass sealing body 30 can also be fixed by an adsorption force caused by the vacuum.

Fourteenth Embodiment

A glass-sealed LED lamp L14 of a fourteenth embodiment shown in FIGS. 21A to 22B is generally same as the glass-sealed LED lamp L9 of the ninth embodiment, and, however, is different from the ninth embodiment in the following point j', and the other points are the same as the ninth embodiment.

{j'} In the outer end portion of the glass sealing body 30, an engaging protrusion 37 protruding downward from the outer end portion is provided. An engaging recess 17 is provided on a side surface of the mounting substrate 10. The engaging protrusion 37 is engaged with the engaging recess 17, whereby the glass sealing body 30 is engaged with the mounting substrate 10. The lower mold 70 is provided with an engaging guide portion 77 for guiding the engaging protrusion 37 to the engaging recess 17.

The manufacturing method of the glass-sealed LED lamp L14 is generally same as the ninth embodiment, and, however, is different from the ninth embodiment in the following point 4-xiv, and the other points are the same as the ninth embodiment.

Figure 22A:
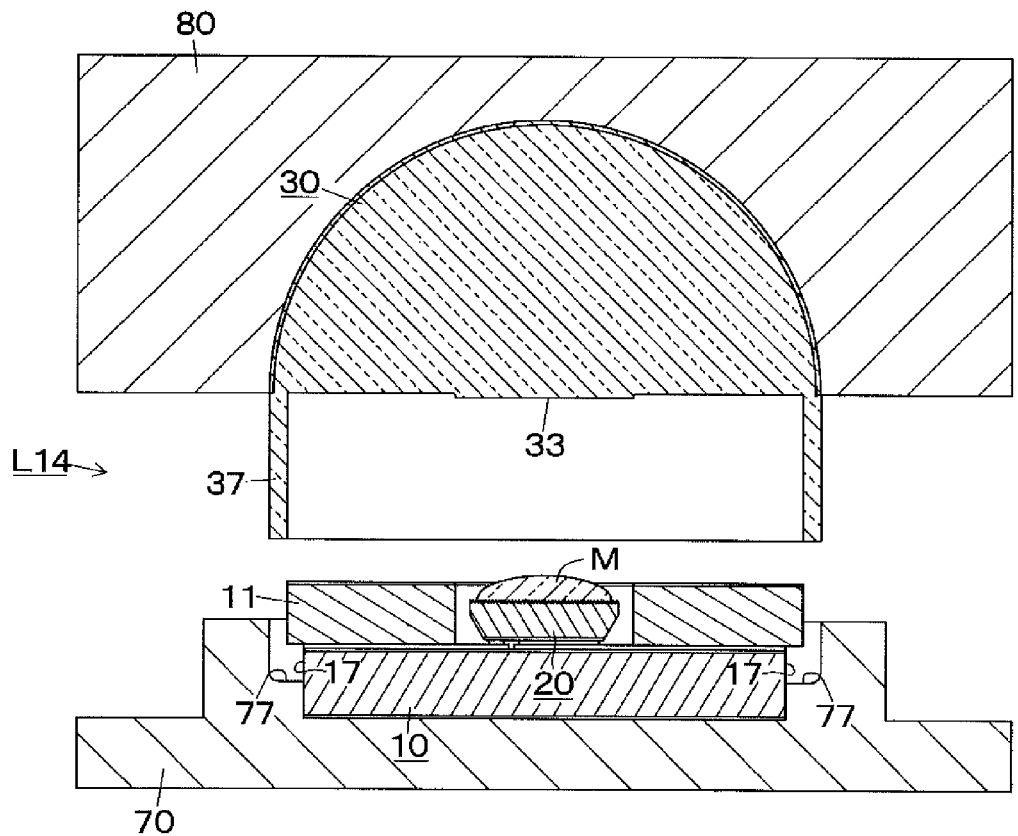
FIGS. 22A and 22B are front sectional views showing a manufacturing process of the glass-sealed LED lamp of the fourteenth embodiment.
Figure 22B:
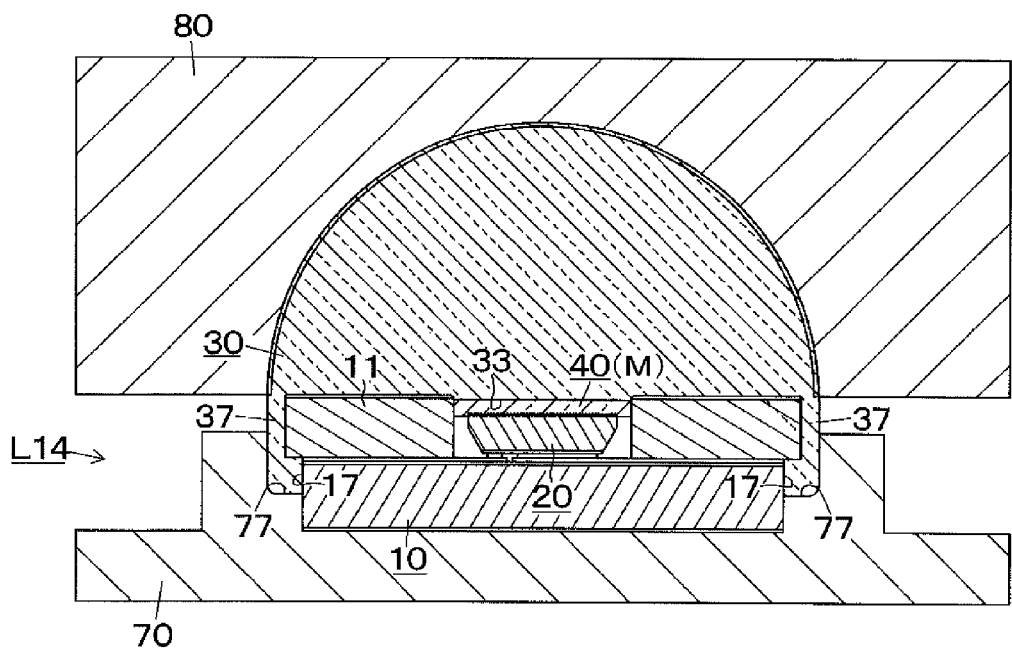

[4-xiv] When the upper mold 80 in which the glass sealing body 30 has been set is placed on the lower mold 70 during pressing, the engaging protrusion 37 is engaged with the engaging recess 17 of the mounting substrate 10 by bending the engaging protrusion 37 inward and winding the engaging protrusion 37 around the engaging guide portion 77 as shown in FIG. 22B.

According to Example 14, the following effect J' can be obtained in addition to the effects B, D, and F described in the first embodiment and the effects A' to F' described in the ninth embodiment.

[J'] Because the glass sealing body 30 and the mounting substrate 10 are mechanically engaged by the engaging protrusion 37, the bonding of the glass sealing body 30 and the mounting substrate 10 becomes stronger compared to the case where the glass sealing body 30 is bonded to the mounting substrate 10 by only the glass bonding portion 40.

Fifteenth Embodiment

Figure 23A:
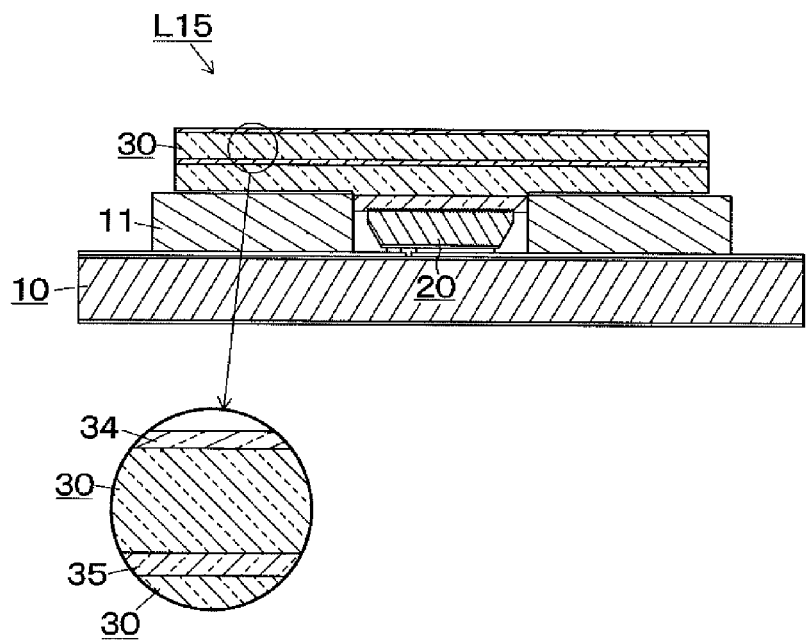
FIG. 23A is a sectional view taken along line XXIII(a)-XXIII(a) in FIG. 23B, showing a glass-sealed LED lamp of a fifteenth embodiment.
Figure 23B:
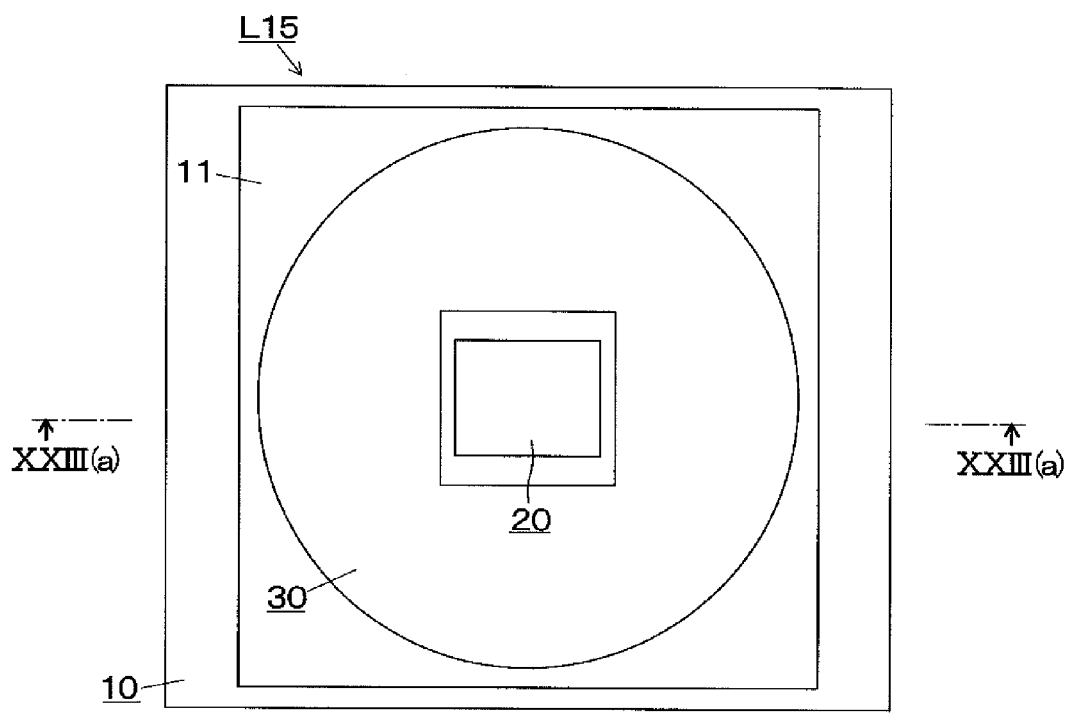
FIG. 23B is a plan view showing the glass-sealed LED lamp of the fifteenth embodiment.

A glass-sealed LED lamp L15 of a fifteenth embodiment shown in FIGS. 23A, 23B is generally same as the glass-sealed LED lamp L9 of the ninth embodiment, and, however, is different from the ninth embodiment in the following point k', and the other points are the same as the ninth embodiment.

{k'} The glass sealing body 30 is formed in a plate shape extending in the longitudinal direction and lateral direction, and a phosphor layer 35 extending in the horizontal direction is provided at a central portion in the vertical direction of the glass sealing body 30.

According to the fifteenth embodiment, the following effect K' can be obtained in addition to the effects B, D, and F described in the first embodiment and the effects A' to F' described in the ninth embodiment.

[K'] Providing the phosphor layer 35 allows light to be efficiently distributed even if the glass sealing body 30 is thin in a vertical direction.

Sixteenth Embodiment

Figure 24A:
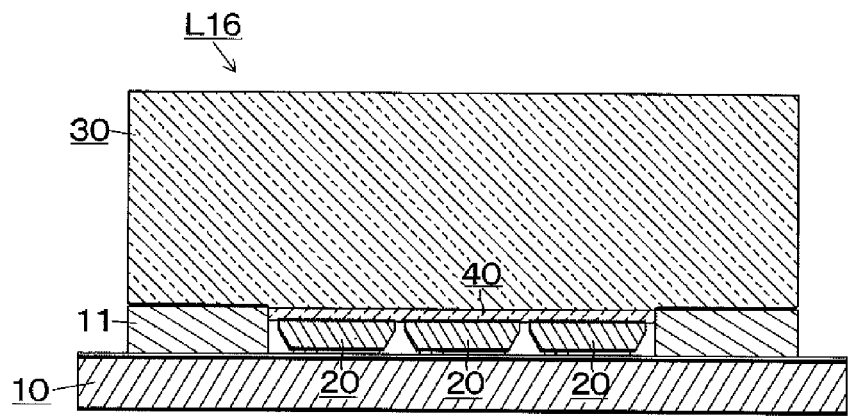
FIG. 24A is a sectional view taken along line XXIV(a)-XXIV(a) in FIG. 24B, showing a glass-sealed LED lamp of a sixteenth embodiment.
Figure 24B:
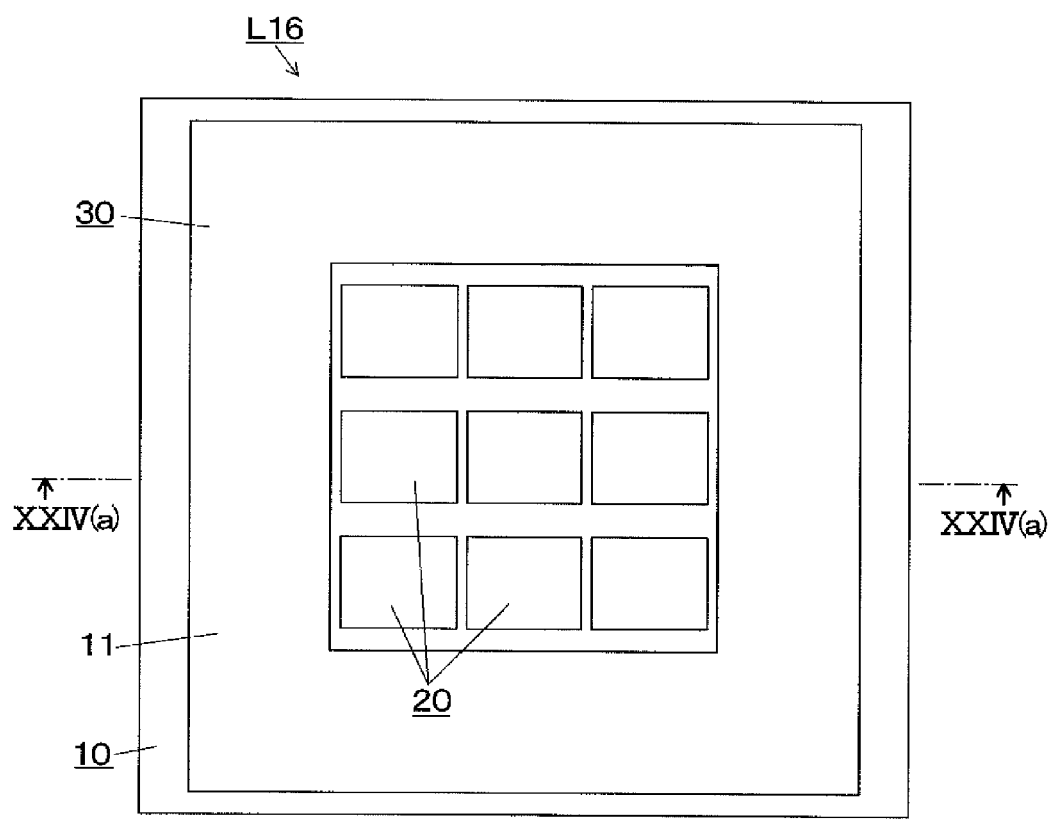
FIG. 24B is a plan view showing the glass-sealed LED lamp of the sixteenth embodiment.
Figure 25:
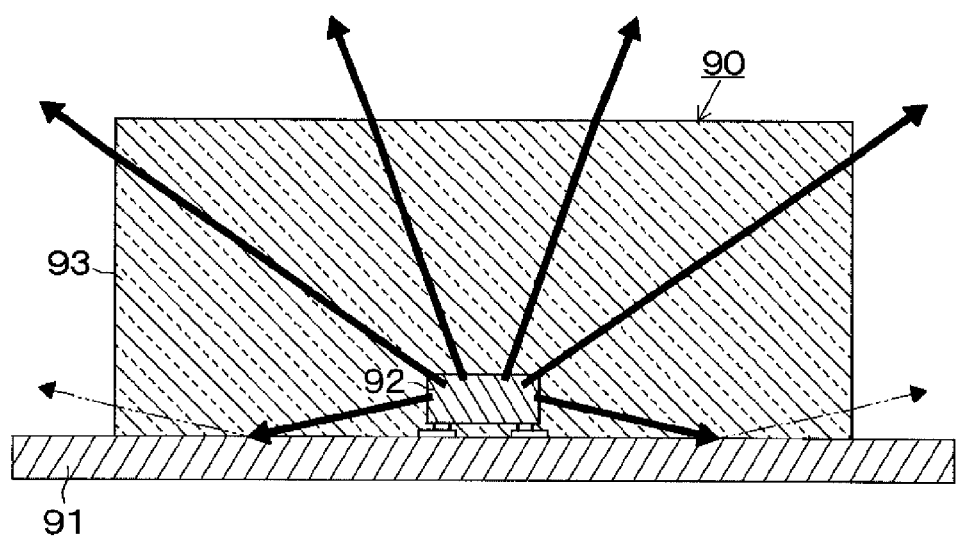
FIG. 25 is a front sectional view showing a glass-sealed LED lamp of a conventional example.

A glass-sealed LED lamp L16 of the sixteenth embodiment shown in FIGS. 24A, 24B is generally same as the glass-sealed LED lamp L9 of the ninth embodiment, and, however, is different from the ninth embodiment in a point that a plurality of LED chips 20 are mounted inward of the peripheral wall member 11, and the other points are the same as the ninth embodiment.

According to the sixteenth embodiment, the effects B, D, and F described in the first embodiment and the effects A' to F' described in the ninth embodiment can be also obtained.

The present invention is not limited to these embodiments, and these embodiments can be modified as appropriate without departing from the scope of the present invention. For example, the following modifications 1, 2 may be made.

[Modification 1]

The LED chip 20 may be bonded to the mounting substrate 10 with solder, metal fine particles, stud bumps (except Au stud bump), and the like instead of being bonded with Au stud bump.

[Modification 2]

In the embodiments 9 to 16, the protrusion 33 may not be provided on the lower surface of the glass sealing body 30, and a central portion of the planar lower surface of the glass sealing body 30 may be bonded to the upper surface of the LED chip 20 through the glass bonding portion 40.

REFERENCE SIGNS LIST 9 glass-sealed LED lamp
9i glass-sealed LED lamp
9j glass-sealed LED lamp
10j mounting substrate
10j mounting substrate
11 peripheral wall member
12 peripheral wall member
13 peripheral wall member
14 white reflector
15 printed wiring
16 engaging recess
18 peripheral wall protrusion
20 LED chip
28 metal wire
30 glass sealing body
30i glass sealing body
30j glass sealing body
31 dielectric film
32 recess
33 protrusion
34 anti-reflective coating
35 phosphor layer
36 engaging protrusion
37 engaging protrusion
38 outer end protrusion
40 glass bonding portion
48 outside glass bonding portion
50 upper mold
50j upper mold
56 engaging guide portion
60 lower mold
70 lower mold
77 engaging guide portion
80 upper mold
L4 to L16 glass-sealed LED lamp
g clearance
g1 clearance
g2 side clearance
g3 side clearance
X interface
M melting glass

The invention claimed is:

1. A glass-sealed LED lamp comprising:
a mounting substrate;
an LED chip mounted on the mounting substrate;
a glass sealing body; and
a glass bonding portion bonding the LED chip to a portion of a lower surface side of the glass sealing body, wherein
a clearance between a planar lower surface of the glass sealing body and an upper surface of the mounting substrate side that face parallel to each other is formed outward of the portion of the lower surface side of the glass sealing body, the clearance causing total reflection of light emitted from the LED chip at an interface between the planar lower surface of the glass sealing body and the clearance.

2. A glass-sealed LED lamp comprising:
a mounting substrate;
an LED chip mounted on the mounting substrate;
a glass sealing body having a recess in a portion of a planar lower surface of the glass sealing body, the recess having an inner peripheral surface that is larger than an outer peripheral surface of the LED chip; and
a glass bonding portion bonding the LED chip to the recess, wherein
a clearance between the planar lower surface of the glass sealing body and an upper surface of the mounting substrate that face parallel to each other is formed outward of the recess, the clearance causing total reflection of light emitted from the LED chip at an interface between the planar lower surface of the glass sealing body and the clearance.

3. The glass-sealed LED lamp according to claim 2, wherein
the glass bonding portion comprises glass having a yielding point lower than a yielding point of glass forming the glass sealing body.

4. The glass-sealed LED lamp according to claim 2, wherein
the glass sealing body comprises a semispherical shape and the planar lower surface is round, and
the recess is formed in a central portion of the planar lower surface.

5. The glass-sealed LED lamp according to claim 2, wherein
the glass sealing body comprises a rectangular parallelepiped shape and the planar lower surface is rectangular, and
the recess is formed in a central portion of the planar lower surface.

6. The glass-sealed LED lamp according to claim 2, wherein
a plurality of the LED chips are mounted on the mounting substrate, and
a plurality of the recesses are formed on the planar lower surface of the glass sealing body.

7. The glass-sealed LED lamp according to claim 2, wherein
a peripheral wall member is mounted outward of the LED chip on the mounting substrate, the peripheral wall member reflecting light inward on an inner peripheral surface of the peripheral wall member.

8. The glass-sealed LED lamp according to claim 7, wherein
the peripheral wall member is provided inward of the recess, and
a side clearance is formed between the outer peripheral surface of the LED chip and the inner peripheral surface of the peripheral wall member, the side clearance causing total reflection of the light emitted from the LED chip at an interface between the LED chip and the side clearance.

9. The glass-sealed LED lamp according to claim 7, wherein
the peripheral wall member is provided outward of the glass sealing body, and
a side clearance is formed between an outer peripheral surface of the glass sealing body and the inner peripheral surface of the peripheral wall member, the side clearance causing total reflection of the light emitted from the LED chip at an interface between the glass sealing body and the side clearance.

10. A glass-sealed LED lamp comprising:
a mounting substrate;
an LED chip mounted on the mounting substrate;
a peripheral wall member mounted outward of the LED chip on the mounting substrate, the peripheral wall member reflecting light inward on an inner peripheral surface of the peripheral wall member;
a glass sealing body; and
a glass bonding portion bonding an upper surface of the LED chip to a portion of a lower surface side of the glass sealing body, wherein
a clearance between a planar lower surface of the glass sealing body and an upper surface of the peripheral wall member that face parallel to each other is formed outward of the portion of the lower surface side of the glass sealing body, the clearance causing total reflection of the light emitted from the LED chip at an interface between the planar lower surface of the glass sealing body and the clearance.

11. The glass-sealed LED lamp according to claim 10, wherein
the glass sealing body is provided with a protrusion in a portion of the planar lower surface, the protrusion having an outer peripheral surface that is smaller than the inner peripheral surface of the peripheral wall member, and
the protrusion comprises the portion of the lower surface side.

12. The glass-sealed LED lamp according to claim 7, wherein
the inner peripheral surface of the peripheral wall member comprises a vertical surface perpendicular to the upper surface of the mounting substrate.

13. The glass-sealed LED lamp according to claim 7, wherein
the inner peripheral surface of the peripheral wall member comprises an inclined surface inclined relative to a vertical surface perpendicular to the upper surface of the mounting substrate in such a manner that an upper side is located outward of a lower side.

14. The glass-sealed LED lamp according to claim 7, wherein
one of white resin and white glass is provided on the inner peripheral surface of the peripheral wall member.

15. The glass-sealed LED lamp according to claim 7, wherein
a plurality of the LED chips are mounted on the mounting substrate, and
the peripheral wall member is mounted outward of the plurality of the LED chips.

16. The glass-sealed LED lamp according to claim 1, wherein
a supporting portion is provided outward of the LED chip and supports the glass sealing body for the mounting substrate.

17. The glass-sealed LED lamp according to claim 16, wherein
the supporting portion includes a protrusion protruding downward from the planar lower surface of the glass sealing body to abut on the upper surface of the mounting substrate side.

18. The glass-sealed LED lamp according to claim 16, wherein
the supporting portion includes a protrusion protruding upward from the upper surface of the mounting substrate side to abut on the planar lower surface of the glass sealing body.

19. The glass-sealed LED lamp according to claim 16, wherein
the supporting portion includes an engaging protrusion protruding downward from the planar lower surface of the glass sealing body to be engaged with the mounting substrate side.

20. The glass-sealed LED lamp according to claim 16, wherein
the supporting portion includes an outside glass bonding portion bonding the planar lower surface of the glass sealing body to the upper surface of the mounting substrate side.

21. The glass-sealed LED lamp according to claim 1, wherein
the glass bonding portion comprises a phosphor layer including a phosphor.

22. The glass-sealed LED lamp according to claim 1, wherein
a metal wire for supplying electricity to the LED chip is passed inside the glass bonding portion.

23. The glass-sealed LED lamp according to claim 1, wherein
a dielectric film causing reflection is formed on the planar lower surface of the glass sealing body in contact with the clearance.

24. A manufacturing method of a glass-sealed LED lamp, the manufacturing method comprising:
mounting an LED chip on a mounting substrate;
setting the mounting substrate in a mold provided with an engaging guide portion guiding an engaging protrusion of a glass sealing body provided with the engaging protrusion in a direction which engages the engaging protrusion with the mounting substrate;
arranging melting glass that has been heated and softened to one of a portion of a lower surface side of the glass sealing body and an upper surface of the LED chip; and
pressing the other against the melting glass and pressing the engaging protrusion against the engaging guide portion so that the upper surface of the LED chip is bonded to the portion of the lower surface side of the glass sealing body through the melting glass, the engaging protrusion is engaged with the mounting substrate to be deformed along the engaging guide portion, and a clearance between a lower surface of the glass sealing body and an upper surface of the mounting substrate side, which causes total reflection at an interface between the glass sealing body and the clearance, is formed outward of the portion of the lower surface side of the glass sealing body.

25. A manufacturing method of a glass-sealed LED lamp, the manufacturing method comprising:
mounting an LED chip on a mounting substrate;

putting melting glass having a yielding point lower than a yielding point of the glass sealing body into a recess of a glass sealing body provided with the recess in a portion of a lower surface of the glass sealing body, the recess having an inner peripheral surface that is larger than an outer peripheral surface of the LED chip;

heating the melting glass at a temperature of the yielding point of the melting glass or more and the yielding point of the glass sealing body or less to soften the melting glass; and pressing the LED chip against the melting glass so that the LED chip is bonded to the recess of the glass sealing body through the melting glass, and a clearance between the lower surface of the glass sealing body and an upper surface of the mounting substrate, which causes total reflection at an interface between the glass sealing body and clearance, is formed outward of the recess.

26. The manufacturing method of a glass-sealed LED lamp according to claim 25, wherein the clearance is formed between a portion other than a portion where printed wiring is provided on the upper surface of the mounting substrate and the lower surface of the glass sealing body by making the lower surface of the glass sealing body abut on the printed wiring, the printed wiring formed on the upper surface of the mounting substrate and raised relative to the portion other than the portion where the printed wiring is provided on the upper surface of the mounting substrate.

27. A manufacturing method of a glass-sealed LED lamp, the manufacturing method comprising:

mounting an LED chip on a mounting substrate;

mounting a peripheral wall member outward of the LED chip on the mounting substrate;

arranging melting glass that has been heated and softened on one of a lower surface of a protrusion of a glass sealing body provided with the protrusion in a portion of a lower surface of the glass sealing body and an upper surface of the LED chip, the protrusion having an outer peripheral surface smaller than an inner peripheral surface of the peripheral wall member; and pressing the other against the melting glass so that the upper surface of the LED chip is bonded to the lower surface of the protrusion of the glass sealing body through the melting glass, and a clearance between a lower surface of the glass sealing body and the upper surface of the peripheral wall member, which causes total reflection at an interface between the glass sealing body and the clearance, is formed outward of the protrusion.

* * * * *